US005560360A

United States Patent [19]
Filler et al.

[11] Patent Number: 5,560,360
[45] Date of Patent: Oct. 1, 1996

[54] IMAGE NEUROGRAPHY AND DIFFUSION ANISOTROPY IMAGING

[75] Inventors: Aaron G. Filler, Seattle; Jay S. Tsurda, Mercer Island; Todd L. Richards, Seattle, all of Wash.; Franklyn A. Howe, London, England

[73] Assignee: University of Washington, Seattle, Wash.

[21] Appl. No.: 28,795

[22] Filed: Mar. 8, 1993

[30] Foreign Application Priority Data

| Mar. 9, 1992 | [GB] | United Kingdom | 9205058 |
| Mar. 13, 1992 | [GB] | United Kingdom | 9205541 |
| Mar. 30, 1992 | [GB] | United Kingdom | 9207013 |
| May 5, 1992 | [GB] | United Kingdom | 9209648 |
| May 21, 1992 | [GB] | United Kingdom | 9210810 |
| Jul. 31, 1992 | [GB] | United Kingdom | 9216383 |
| Jan. 22, 1993 | [GB] | United Kingdom | 9301268 |

[51] Int. Cl.$^6$ ............................................. A61B 5/055
[52] U.S. Cl. .................................. 128/653.2; 324/307
[58] Field of Search ........................ 128/653.1, 653.2, 128/653.3; 324/307, 309

[56] References Cited

U.S. PATENT DOCUMENTS

| 3,735,247 | 5/1973 | Harker | 128/653.1 |
| 4,902,973 | 2/1990 | Keren | 324/312 |
| 5,070,876 | 12/1991 | Wright | 128/653.3 |
| 5,078,141 | 1/1992 | Suzuki et al. | 324/309 |
| 5,079,505 | 1/1992 | Deimling et al. | 324/309 |
| 5,134,372 | 7/1992 | Inoue | 324/309 |
| 5,151,655 | 9/1992 | Harms et al. | 324/309 |
| 5,218,964 | 6/1993 | Sepponen | 324/309 |
| 5,250,899 | 10/1993 | Listerud et al. | 324/309 |
| 5,261,405 | 11/1993 | Fossel | 128/653.2 |

*Primary Examiner*—Marvin M. Lateef
*Assistant Examiner*—Brian L. Casler
*Attorney, Agent, or Firm*—Christensen, O'Connor, Johnson & Kindness PLLC

[57] ABSTRACT

A neurography system (10) is disclosed for generating diagnostically useful images of neural tissue (i.e., neurograms) employing a modified magnetic resonance imaging system (14). In one embodiment, the neurography system selectively images neural tissue by employing one or more gradients to discriminate diffusion anisotropy in the tissue and further enhances the image by suppressing the contribution of fat to the image. The neurography system is part of a broader medical system (12), which may include an auxiliary data collection system (22), diagnostic system (24), therapeutic system (26), surgical system (28), and training system (30). These various systems are all constructed to take advantage of the information provided by the neurography system regarding neural networks, which information was heretofore unavailable.

66 Claims, 17 Drawing Sheets

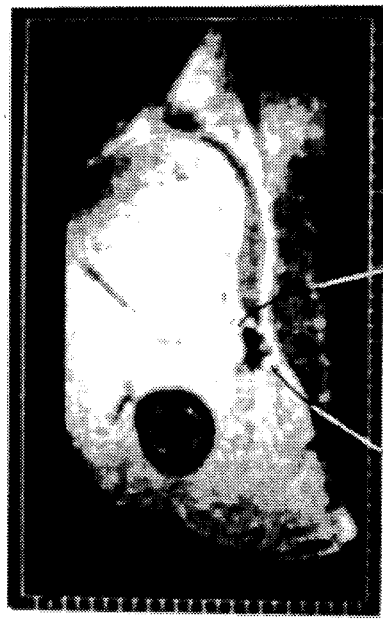
fig.12.
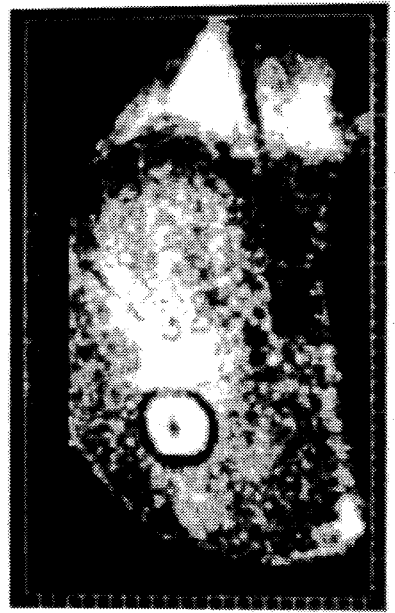
fig.13.B.
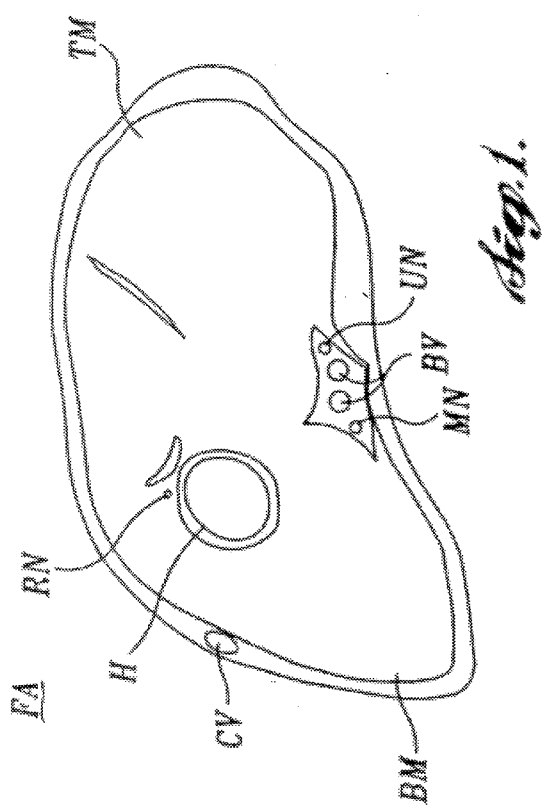
fig.1.
fig.13.A.

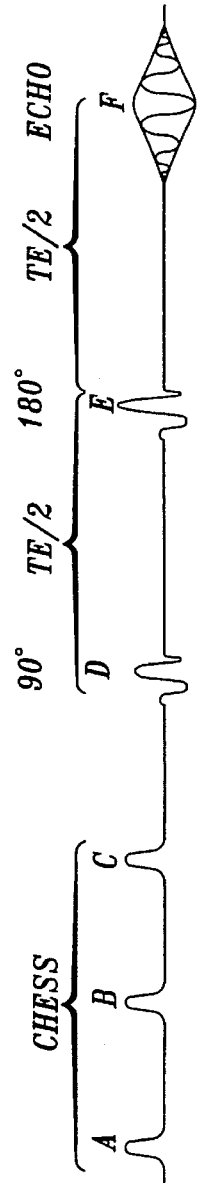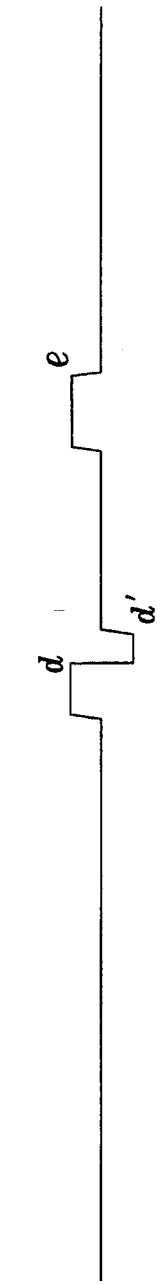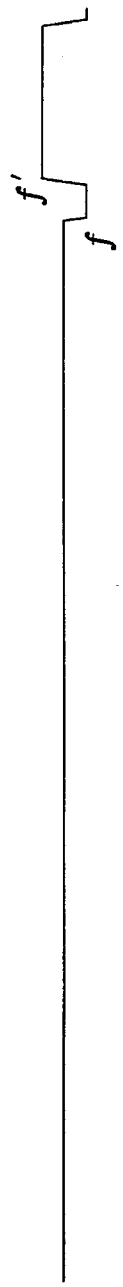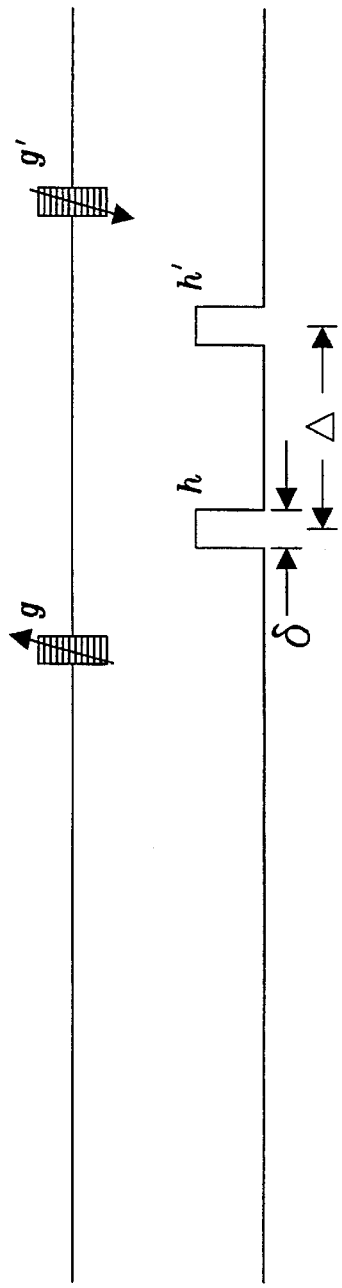
Fig. 11A. RADIO FREQUENCY PULSES
Fig. 11B. DEPHASING/SPOILER GRADIENTS
Fig. 11C. SLICE SELECTION GRADIENTS
Fig. 11D. FREQUENCY ENCODING/READOUT GRADIENT
Fig. 11E. PHASE ENCODING
Fig. 11F. DIFFUSION SENSITIZING GRADIENTS

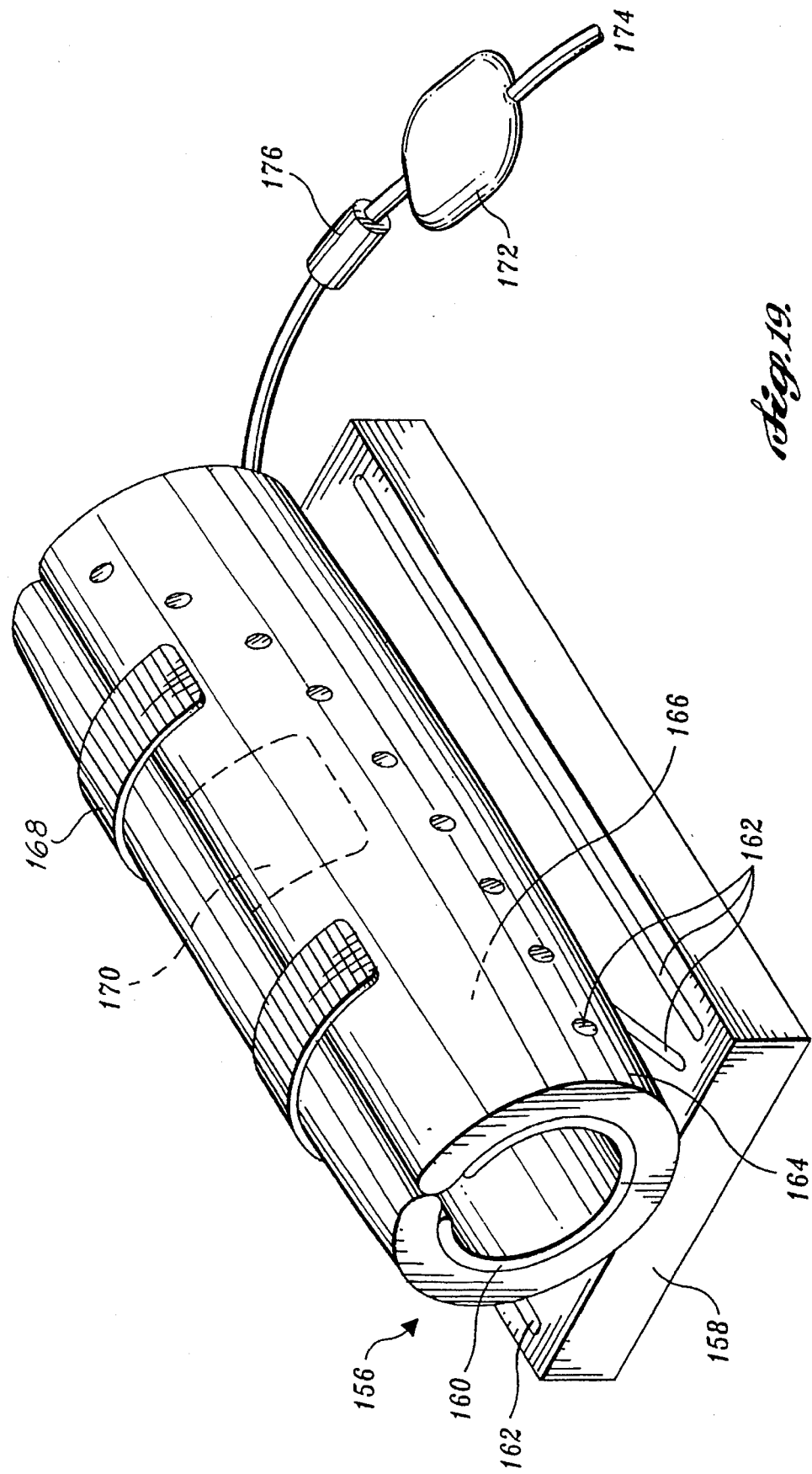

IMAGE NEUROGRAPHY AND DIFFUSION ANISOTROPY IMAGING

This application is based upon an earlier filed U.K Patent Application No. 9301268.0, filed Jan. 22, 1993, which, in turn, is a continuation-in-part of U.K. Patent Application No. 9216383.1, filed Jul. 31, 1992, which, in turn, is a continuation-in-part of U.K. Patent Application No. 9210810.9, filed May 21, 1992, which, in turn, is a continuation-in-part of U.K. Patent Application No. 9209648.6, filed May 5, 1992, which, in turn, is a continuation-in-part of U.K. Patent Application No. 9207013.5, filed Mar. 30, 1992, which, in turn, is a continuation-in-part of U.K. Patent Application No. 9205541.7, filed Mar. 13, 1992, which, in turn, is a continuation-in-part of parent U.K. Patent Application No. 9205058.2, filed Mar. 9, 1992, the benefit of the filing dates of which is hereby claimed pursuant to 35 U.S.C. §119.

FIELD OF THE INVENTION

The present invention relates generally to the field of imaging and, more particularly, to the imaging of nerve tissue and other diffusionally anisotropic structures.

BACKGROUND OF THE INVENTION

Although many techniques have been developed for locating and viewing the brain, spinal cord, and spinal roots within the spinal canal, hitherto there has not been a successful method for viewing the peripheral, autonomic, and cranial nerves. These nerves, collectively referred to herein as peripheral nerves, commonly travel through and along bone, muscle, lymphatics, tendons, ligaments, intermuscular septa, collections of fatty tissues, air and fluid spaces, veins, arteries, joints, skin, mucous membranes and other tissues. The relatively small size of peripheral nerves, as well as their close proximity to other tissue of comparable size and shape, makes them difficult to locate and identify.

The examination of peripheral nerves is further complicated by the complexity of many such neural structures, such as the brachial plexus, lumbar plexus, and sacral plexus. These structures include bundles of nerves that may join together, separate, rejoin, intermix, and resegregate, forming intricate three dimensional patterns. A compression or irritation of a small area of nerve within such a plexus (e.g. in the shoulder) can cause pain, numbness, weakness or paralysis at some distant site (e.g. in one finger). Even when a surgeon attempts to expose the plexus for direct inspection, the anatomic complexity can prove overwhelming, rendering diagnosis inconclusive and surgery difficult and dangerous.

Radiologic methods employing, for example, X-rays, have been developed to generate tissue specific images of various physiological structures including bone, blood vessels, lymphatics, the gastrointestinal tract, and the tissues of the central nervous system. Due in part to the neural characteristics noted above, however, these techniques have not been successfully used to generate suitable clinical images of peripheral nerves.

Typically, the position of peripheral nerves in radiologic images has been inferred by reference to more conspicuous, non-neural structures such as tendons, vessels, or bone. For example, by producing an X-ray image of a region of the body through which a nerve of interest passes, non-neural structures can often be readily identified. Then, the locations of peripheral nerves in the region can be inferred from standard reference information about human anatomy. Due to the variability of nerve position from one individual to another, however, this technique is of limited value.

One approach of particular interest that has been used to image physiological structures is magnetic resonance imaging (MRI). By way of introduction, MRI involves the exposure of tissue to a variety of different magnetic and radio-frequency (rf) electromagnetic fields. The response of the specimen's atomic nuclei to the fields is then processed to produce an image of the specimen.

More particularly, the specimen is initially exposed to a polarizing magnetic field. In the presence of this field, nuclei exhibiting magnetic moments (hereinafter referred to as spins) will seek to align themselves with the field. The nuclei precess about the polarizing field at an angular frequency (hereinafter referred to as the Larmor frequency) whose magnitude depends upon both the field's strength and the magnetogyric constant of the specific nuclear species involved.

Although the magnetic components of the spins cancel each other in a plane perpendicular to the polarizing field, the spins exhibit a net magnetic moment in the direction of the polarizing field. By applying an excitation field perpendicular to the polarizing field and at a frequency near the Larmor frequency, the net magnetic moment can be tilted. The tilted magnetic moment includes a transverse component, in the plane perpendicular to the polarizing field, rotating at the Larmor frequency. The extent to which the magnetic moment is tilted and, hence, the magnitude of the net transverse magnetic moment, depends upon the magnitude and duration of the excitation field.

An external return coil is used to sense the field associated with the transverse magnetic moment, once the excitation field is removed. The return coil, thus, produces a sinusoidal output, whose frequency is the Larmor frequency and whose amplitude is proportional to that of the transverse magnetic moment. With the excitation field removed, the net magnetic moment gradually reorients itself with the polarizing field. As a result, the amplitude of the return coil output decays exponentially with time.

Two factors influencing the rate of decay are known as the spin-lattice relaxation coefficient $T_1$ and the spin-spin relaxation coefficient $T_2$. The spin-spin relaxation coefficient $T_2$ represents the influence that interactions between spins have on decay, while the spin-lattice relaxation coefficient $T_1$ represents the influence that interactions between spins and fixed components have on decay. Thus, the rate at which the return coil output decays is dependent upon, and indicative of, the composition of the specimen.

By employing an excitation field that has a narrow frequency band, only a relatively narrow band within a nuclear species will be excited. As a result, the transverse magnetic component and, hence, return coil output, will exhibit a relatively narrow frequency band indicative of that band of the nuclear species. On the other hand, if the excitation field has a broad frequency band, the return coil output may include components associated with the transverse magnetic components of a greater variety of frequencies. A Fourier analysis of the output allows the different frequencies, which can be indicative of different chemical or biological environments, to be distinguished.

In the arrangement described above, the contribution of particular spins to the return coil output is not dependent upon their location within the specimen. As a result, while the frequency and decay of the output can be used to identify components of the specimen, the output does not indicate the location of components in the specimen.

To produce such a spatial image of the specimen, gradients are established in the polarizing field. The direction of the polarizing field remains the same, but its strength varies along the x, y, and z axes oriented with respect to the specimen. By varying the strength of the polarizing field linearly along the x-axis, the Larmor frequency of a particular nuclear species will also vary linearly as a function of its position along the x-axis. Similarly, with magnetic field gradients established along the y-axis and z-axis, the Larmor frequency of a particular species will vary linearly as a function of its position along these axes.

As noted above, by performing a Fourier analysis of the return coil's output, the frequency components of the output can be separated. With a narrow band excitation field applied to excite a select nuclear species, the position of a spin relative to the xyz coordinate system can then be determined by assessing the difference between the coil output frequency and the Larmor frequency for that species. Thus, the MRI system can be constructed to analyze frequency at a given point in time to determine the location of spins relative to the magnetic field gradients and to analyze the decay in frequency to determine the composition of the specimen at a particular point.

The generation and sensing of the fields required for proper operation of an MRI system is achieved in response to the sequential operation of, for example, one or more main polarizing field coils, polarizing gradient field coils, rf excitation field coils, and return field coils. Commonly, the same coil arrangement is used to generate the excitation field and sense the return field. A variety of different sequences have been developed to tailor specific aspects of MRI system operation, as described, for example, in U.S. Pat. No. 4,843,322 (Glover); U.S. Pat. No. 4,868,501 (Conolly); and U.S. Pat. No. 4,901,020 (Ladebeck et al.).

One application of conventional MRI systems is in the production of angiograms, or blood vessel images. Various different pulse sequences and processing techniques have been developed for use in MRI angiography, as described in, for example, U.S. Pat. No. 4,516,582 (Redington); U.S. Pat. No. 4,528,985 (Macovski); U.S. Pat. No. 4,647,857 (Taber); U.S. Pat. No. 4,714,081 (Dumoulin et al.); U.S. Pat. No. 4,777,957 (Wehrli et al.); and U.S. Pat. No. 4,836,209 (Nishimura).

As will be appreciated, blood vessels are readily differentiated from surrounding tissue by the pulsatile flow of blood therethrough. MRI angiography exploits this distinguishing characteristic to generate images of the blood vessels in various ways. For example, if the excitation field is pulsed at systole and diastole, the contribution of blood flow to the return field will differ, while the contribution of static tissue and bone to the return field will be the same. By subtracting one return from the other, the static component cancels, leaving only the contribution from the blood vessel.

Unfortunately, because peripheral nerve does not exhibit the flow-distinctiveness of blood vessels, MRI angiography systems and pulse sequences can not be used to generate suitable images of peripheral nerve. Further, conventional MRI systems and sequences used for general imaging of tissue and bone do not provide acceptable results. Given the poor signal-to-noise (S/N) ratio of the return signals (e.g., on the order of 1× to 1.5×) and the small size of the nerve, the conspicuity of imaged nerves relative to other tissue is collectively rendered so poor as to be diagnostically useless.

One technique proposed for use in enhancing the utility of MRI systems in imaging neural tissue involves the use of pharmaceutical agents to enhance the contrast of neural tissue relative to surrounding tissue in the images produced. As described in PCT Patent Application No. PCT EP 91/01780 (Filler et al., WO 92/04916), published on Apr. 2, 1992, a two-part contrast agent, such as wheat germ agglutinin or dextrin-magnetite, is injected so that it is subsequently taken up, and transported, by the nerve of interest. The first part of the agent promotes neural uptake, while the second part of the agent has the desired "imageable" property.

The agent is injected into muscle and undergoes axoplasmic flow in the nerve supplying that muscle, tagging the nerve in subsequently generated images of the specimen. If MRI is used, the second part of the agent is selected to have a magnetically active (e.g., ferrite) component. An agent having a high nuclear density can, however, be used to increase the contrast of the nerve upon X-ray or computed tomography (CT) examination, while a radioactive (e.g. positron emitting) element can be used to enhance visibility during positron emission tomography (PET) scanning.

To illustrate the effectiveness of contrast agents in imaging nerve, reference is had to FIGS. 1–5. In that regard, FIG. 1 is a diagram of a transverse section of the upper forearm FA of a rabbit. The forearm includes the triceps muscle TM, ulnar nerve UN, brachial veins BV, median nerve MN, radial nerve RN, humerus H, cephalic vein CV, and biceps muscle BM.

FIGS. 2A and 2B illustrate spin-echo MR images of such a section, using a ferrite contrast agent, produced by a conventional MRI system at six-hour intervals. Although some of the larger structural elements are readily identified, the location of some objects appears skewed. More particularly, the humerus marrow appears shifted relative to the humerus H, as do ligaments L, and fat F between the biceps or triceps. In addition, smaller neural structures are difficult to distinguish.

Several approaches are available, however, to attempt to identify nerves in the images generated. For example, as shown in FIG. 3, if a short tau inversion recovery (STIR) sequence of the type described in Atlas et al., *STIR MR Imaging of the Orbit*, 151 AM. J. ROENTGEN. 1025–1030 (1988) is used, the humerus marrow disappears from the image as does, more importantly, certain ambiguous, apparently non-neural structures adjacent the median nerve MN. Thus, as shown in the enlarged image of the region including the median nerve MN and ulnar nerve UN, provided in FIG. 4, the median nerve MN is visible.

Similarly, even when the contrast agent images of FIGS. 2A and 2B are enlarged to better illustrate the region including the median nerve MN, as shown in FIGS. 5A and 5B, respectively, the nerves are distinguishable to a highly skilled observer. More particularly, transport of the ferrite contrast agent during the six-hour interval between the generation of images 4A and 4B results in a loss of intensity in the MN relative to the non-neural structure adjacent median nerve MN. Given this observation and the STIR-based assessment, the median nerve MN can, thus, be identified.

The use of contrast agents, while promising, does have certain limitations. For example, there is an increasing preference to avoid the use of invasive technologies in medicine whenever possible. Further, contrast agents generally can be used to image only a single nerve or nerve group. Of perhaps greatest importance, the contrast agents employed typically reduce the intensity of the imaged nerve. Since nerves are already difficult to see in current MRI images, the impact of the contrast agent upon the image can be difficult to interpret, as illustrated by the discussion of FIGS. 2–5 above.

In another application, MRI has been used, without contrast agents, to map non-peripheral, white matter nerve tracts in the brain. The white matter tracts extend through gray matter tissue in the brain and exhibit relatively high anisotropic diffusion. More particularly, given their physical structure (i.e., axonal pathways surrounded by myelin sheaths), water mobility along the white matter tracts is relatively high, while water mobility perpendicular to the tracts is low. The surrounding gray matter does not, however, exhibit this same anisotropy.

A technique for MRI-based mapping of white matter nerve tracts that exploits this characteristic of neural tissue is described in Douek et al., *Myelin Fiber Orientation Color Mapping*, BOOK OF ABSTRACTS, SOCIETY OF MAGNETIC RESONANCE IN MEDICINE, p. 910 (1991). Basically, in addition to the fields and gradients described above, this process involves the use of a pair of field gradient pulses (hereinafter referred to as diffusion gradients), oriented perpendicular and parallel to the white matter tracts to be imaged. The effect of a pulsed gradient is to change the phase of the received signal from all of the spins. For stationary spins the effect of the two diffusion gradients cancels out. In contrast, spins moving from one spatial position to another in the time between the two diffusion gradients experience changes in the frequency and phase of the spin magnetization with the net effect being a reduction in the received signal. The signal reduction is greatest for those spins that diffuse the greatest distance between the two pulsed gradients.

As noted above, given the anisotropic nature of the tracts, water will diffuse freely along a tract, but is restricted in it motion perpendicular to the tract. When the diffusion gradient is aligned with the tract there is thus a greater reduction in signal than when the diffusion gradient is aligned perpendicular to the tract. Because this phenomenon is not exhibited by the surrounding gray matter tissue, the white matter tracts can be identified.

Anisotropic diffusion is also a recognized characteristic of peripheral nerve, as indicated in Moseley et al., *Anisotropy in Diffusion-Weighted MRI*, 19 MAGNETIC RESONANCE ON MEDICINE 321 (1991). The Douek et al. technology, however, does not distinguish peripheral nerve from muscle and other tissue for a number of previously unrecognized reasons. First, while the size and structure of the white matter tracts ensure that the resultant signals will be sufficiently strong for imaging, peripheral nerve is considerably smaller and more difficult to distinguish. Second, unlike the white matter tracts, peripheral nerve is commonly surrounded by muscle and fat, both of which impair the ability of the Douek et al. system to image nerve.

By way of elaboration, given its fibrous structure, muscle also exhibits diffusional anisotropy, as recognized in Moseley et al., *Acute Effects of Exercise on Echo-Planar $T_2$ and Diffusion-Weighted MRI of Skeletal Muscle in Volunteers*, BOOK OF ABSTRACTS, SOCIETY OF MAGNETIC RESONANCE IN MEDICINE 108 (1991). As a result, the simple anisotropic analysis of Douek et al. is unable to distinguish peripheral nerve and muscle. While fat is isotropic and, therefore, distinguishable from nerve, it also impairs the imaging of peripheral nerves. Specifically, the relative signal strength of fat returns to neural returns is so high as to render peripheral nerves unidentifiable in images produced.

As will be appreciated from the preceding remarks, it would be desirable to develop a method for rapidly and non-invasively imaging a single peripheral nerve, or an entire neural network, without resort to contrast agents. The images generated should be sufficiently detailed and accurate to allow the location and condition of individual peripheral nerves to be assessed. It would further be desirable to provide a system that processes neural images to enhance the information content of the images, diagnose neural trauma and disorders, and inform and control the administration of treatments and therapy.

SUMMARY OF THE INVENTION

The present disclosure relates to a new method, which quite remarkably, is capable of generating a three dimensional image of an individual patient's nerves and nerve plexuses. The image can be acquired non-invasively and rapidly by a magnetic resonance scanner. These images are acquired in such a way that some embodiments of the invention are able to make all other structures in the body including bone, fat, skin, muscle, blood, and connective tissues tend to disappear so that only the nerve tree remains to be seen. A plurality of the nerves passing through a given imaged region may be observed simultaneously, thus alleviating any ambiguity of nerve identification which might arise were only a single nerve imaged as with some contrast agent techniques.

The invention is based on the discovery of a method of collecting a data set of signal intensities with spatial coordinates which describes the positions of the nerves within any two dimensional cross section of a living mammal or within any three dimensional data acquisition space. There exist a large number of pulse sequences capable of controlling or operating a magnetic resonance imaging apparatus and each of which accomplishes some preferred image optimization. Previously, however, no simple (single) or complex (double or multiple) pulse sequence has been able to increase the relative signal intensity of nerve so that it is brighter than all other tissues in the body or limb cross section. Surprisingly, the inventors have discovered that there are certain novel ways of assembling complex pulse sequences, wherein even though the simple components of the sequence decrease the signal-to-noise ratio of nerve or decrease the signal strength of nerve relative to other tissues, the fully assembled complex sequence actually results in the nerve signal being more intense than any other tissue. In this fashion, the image conspicuity of nerve is greatly increased.

Thus, a first aspect of the present invention provides a method of selectively imaging neural tissue of a subject without requiring use of intraneural contrast agents, the method comprising subjecting part of the subject anatomy to magnetic resonance imaging fields, detecting magnetic resonance and producing an image of neural tissue from said detected resonance so that a nerve, root, or neural tract of interest in said image can be visually differentiated from surrounding structures.

A second aspect of the present invention provides a method of selectively imaging neural tissue of a subject, the method comprising subjecting part of the subject anatomy to magnetic resonance imaging fields adapted to discriminate anisotropy of water diffusion or other special characteristic of neural tissue, detecting magnetic resonance to produce an electronic signal in accordance with said resonance and producing an image of neural tissue from said electronic signal.

The invention also provides an apparatus for selectively imaging neural tissue of a subject without requiring the use of neural contrast agents, the apparatus comprising means for subjecting part of the subject anatomy to magnetic resonance fields, means for detecting magnetic resonance to produce an electronic signal in accordance with said resonance, and means for producing an image of neural tissue from said electronic signal so that a nerve, root, or neural tract of interest in said image can be visually differentiated from surrounding structures.

The invention also finds expression as an apparatus for imaging neural tissue of a subject, the apparatus comprising means for subjecting part of the subject anatomy to magnetic resonance fields adapted to discriminate anisotropy of water diffusion, means for detecting magnetic resonance to produce an electronic signal in accordance with said resonance and means for producing a selective image of neural tissue of interest from said electronic signal.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1 is a diagram of a transverse section of the upper forearm of a rabbit illustrating various neural and non-neural structures;

FIGS. 11A through 11F illustrate one sequence of pulses suitable for use in producing diagnostically suitable images from the neurography system of FIG. 6;

FIG. 12 is another image of the upper forearm of a rabbit produced by an embodiment of the neurography system employing fat suppression;

FIGS. 13A and 13B are additional images of the upper forearm of a rabbit produced by an embodiment of the neurography system employing gradients perpendicular and parallel, respectively, to the anisotropic axis of nerve being imaged;

FIGS. 15A through 15C are images produceable by the neurography system with zero, perpendicular, and parallel gradients, while

FIG. 19 illustrates a splint employed in the neurography and medical systems of the present invention;

DETAILED DESCRIPTION OF THE PREFERRED EMBODIMENT

Figure 2B:
FIGS. 2A and 2B are images of the upper forearm of a rabbit, of the type depicted in FIG. 1, produced using an MRI system at two spaced-apart times after the forearm was injected with a ferrite contrast agent.
Figure 5B:
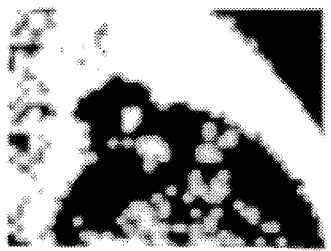
FIGS. 5A and 5B are enlargements of a portion of the images of FIGS. 2A and 2B, respectively, associated with a peripheral nerve of interest.
Figure 2A:
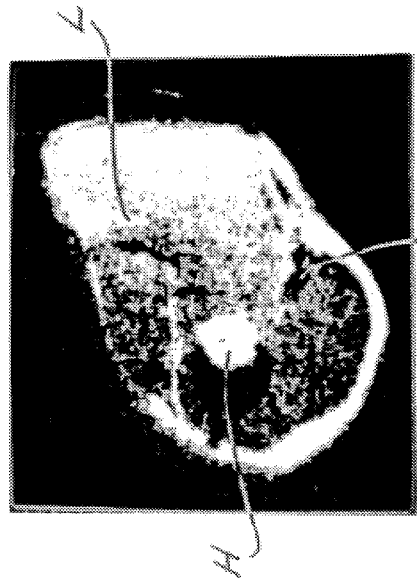
Figure 5A:
Figure 3:
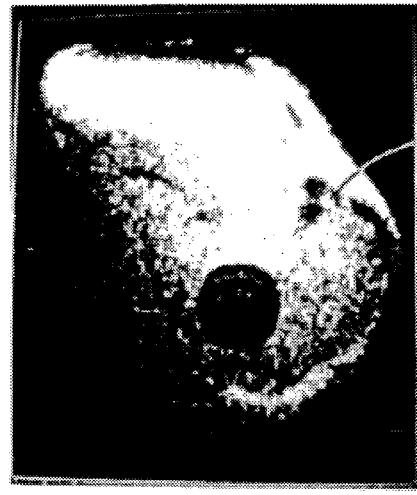
FIG. 3 is another image of the upper forearm of a rabbit produced using an MRI system employing a short tau inversion recovery (STIR) spin-echo sequence.
Figure 4:
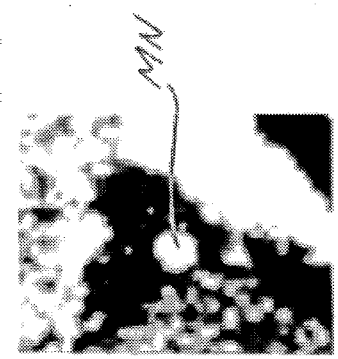
FIG. 4 is an enlargement of a portion of the image of FIG. 3 associated with a peripheral nerve of interest.
Figure 6:
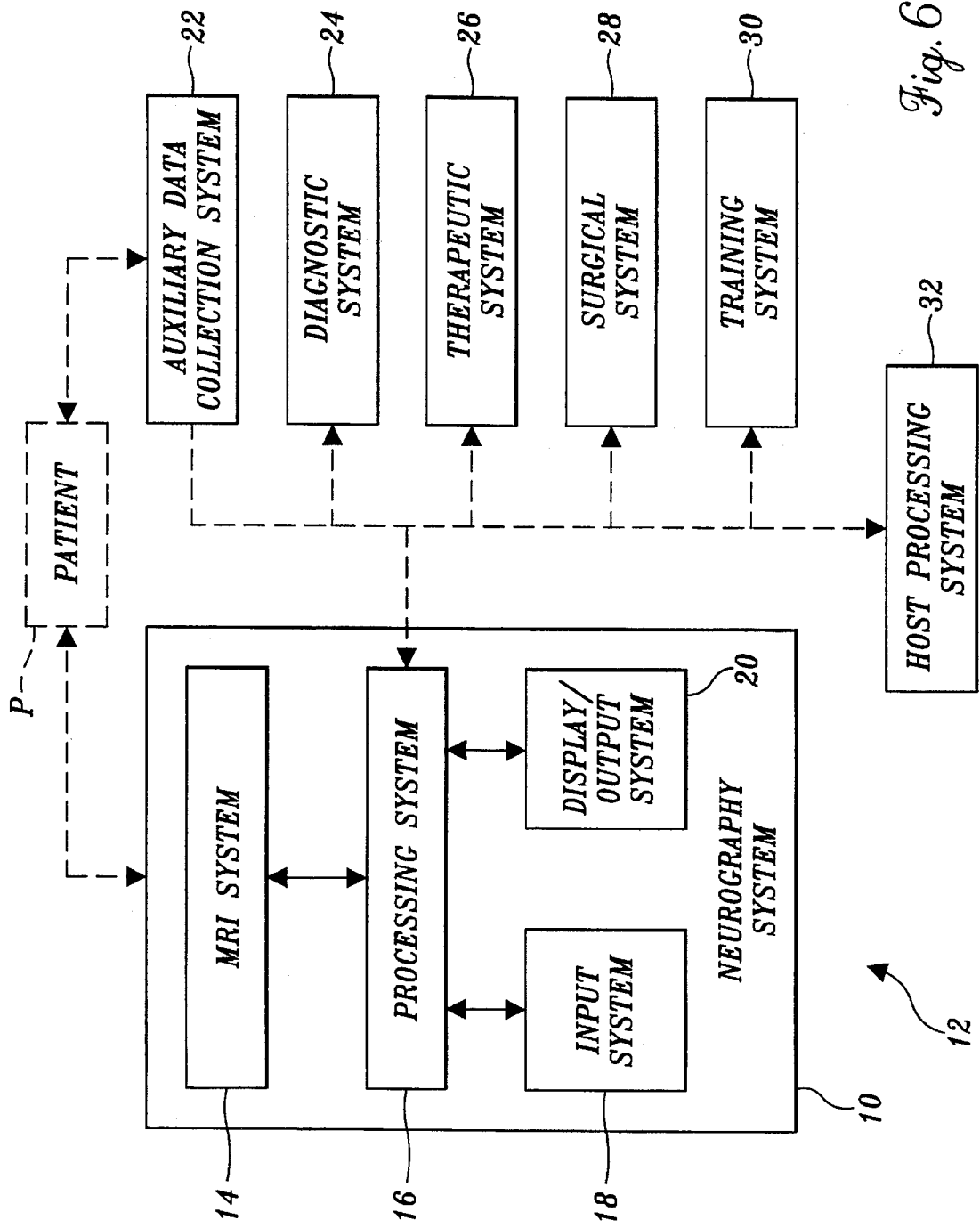
FIG. 6 is a block diagram of a neurography system, constructed in accordance with this invention, coupled to a plurality of other systems designed to provide information to the neurography system and to implement, for example, neural diagnoses, therapy, surgery, and training.

Referring now to FIG. 6, a neurography system 10 is shown as one component of a broader medical system 12. Unlike prior art arrangements, system 10 quickly and non-invasively generates accurate images showing the pattern of individual peripheral nerves, or entire nerve trees, without the use of contrast agents. The system is designed to allow such images, hereinafter referred to as neurograms, to be displayed in two-dimensions, illustrating neural cross sections in the specimen under examination, or in three-dimensions. The images may selectively exclude all other structures within the specimen, or may illustrate the physical relationship of other structures relative to the nerves for reference.

1. Medical System Overview

As shown in FIG. 6, the neurography system 10 included in medical system 12 includes four basic components: MRI system 14, processing system 16, input system 18, and output/display system 20. In the preferred arrangement, the MRI system 14 is a conventional MRI system modified for use in collecting image data of a patient P under examination. The processing system 16 responds to operator inputs applied via input system 18 to control MRI system 14 and process its output to display the resultant neurograms at system 20. As will be described in greater detail below, system 16 employs a variety of different imaging protocols, alone or in combination, to ensure that the images produced are of a quality heretofore unachieved.

The medical system 12 includes a number of components that supplement the imaging information produced by system 10 and/or use that information for a variety of purposes. For example, an auxiliary data collection system 22 may be included to collect image information about non-neural structures, such as blood vessels and bone, in the imaged region of patient P. This information can then be used to suppress and/or enhance the appearance of those structures in the neurograms produced by system 10.

A diagnostic system 24, included in system 12, may be used to analyze the images produced by system 10. Given the high resolution, detail, and accuracy of neurograms produced by system 10, system 24 can be programmed to analyze neural pathway information to detect discontinuities associated with, for example, neural compressions, injuries, and tumors. System 24 provides outputs indicative of the location of discontinuities and may, by consultation with a database of image information associated with clinically assessed abnormalities, provide an indication of the nature and magnitude of an imaged discontinuity. These outputs can be used for diagnosis, or applied as feedback to system 10 to refine a region of interest (ROI) under examination in patient P.

Medical system 12 may also include a therapeutic system 26 and surgical system 28. Systems 26 and 28 employ information about the patient's neural structure from system 10 to assist in the proper administration of a desired therapeutic or surgical operation. For example, the information may be used to guide a robotic stylus to a damaged neural site for treatment or to allow an operation on non-neural structure to be performed without damage to the patient's peripheral nerves. The systems 26 and 28 may operate independent of physician control or may simply provide the physician with real-time feedback concerning the relationship between an operation being performed and the patient's neural structures.

A training and development system 30 is included in the medical system 12 for a variety of different purposes. For example, the training system 30 may be used to demonstrate the anatomy of various neural structures, along with their positional relationship to non-neural patient structures. This information has great educational value given the extremely limited ability of prior an techniques, including direct examination, to provide detailed anatomical information. Training system 30 may also be designed to analyze the effectiveness of neurography system 10 and provide feedback used to control the pulse sequences and other operational parameters of system 10.

As one final component, medical system 12 may include a host processing system 32 in addition to, or in place of, separate processing systems in the other components of system 12. Although not separately shown in FIG. 6, system 32 includes a central processing unit (CPU) coupled to the remainder of system 12 by input/output circuits. Memory is provided to store software instructions, used to control the operation of the CPU and, hence, the various components of system 12, and to store image and other data collected by system 12. The use of a separate host processing system 32 is particularly desirable where various components of system 12 are to be operated in interactive fashion pursuant to a single set of software instructions.

2. The Neurography System

Figure 7:
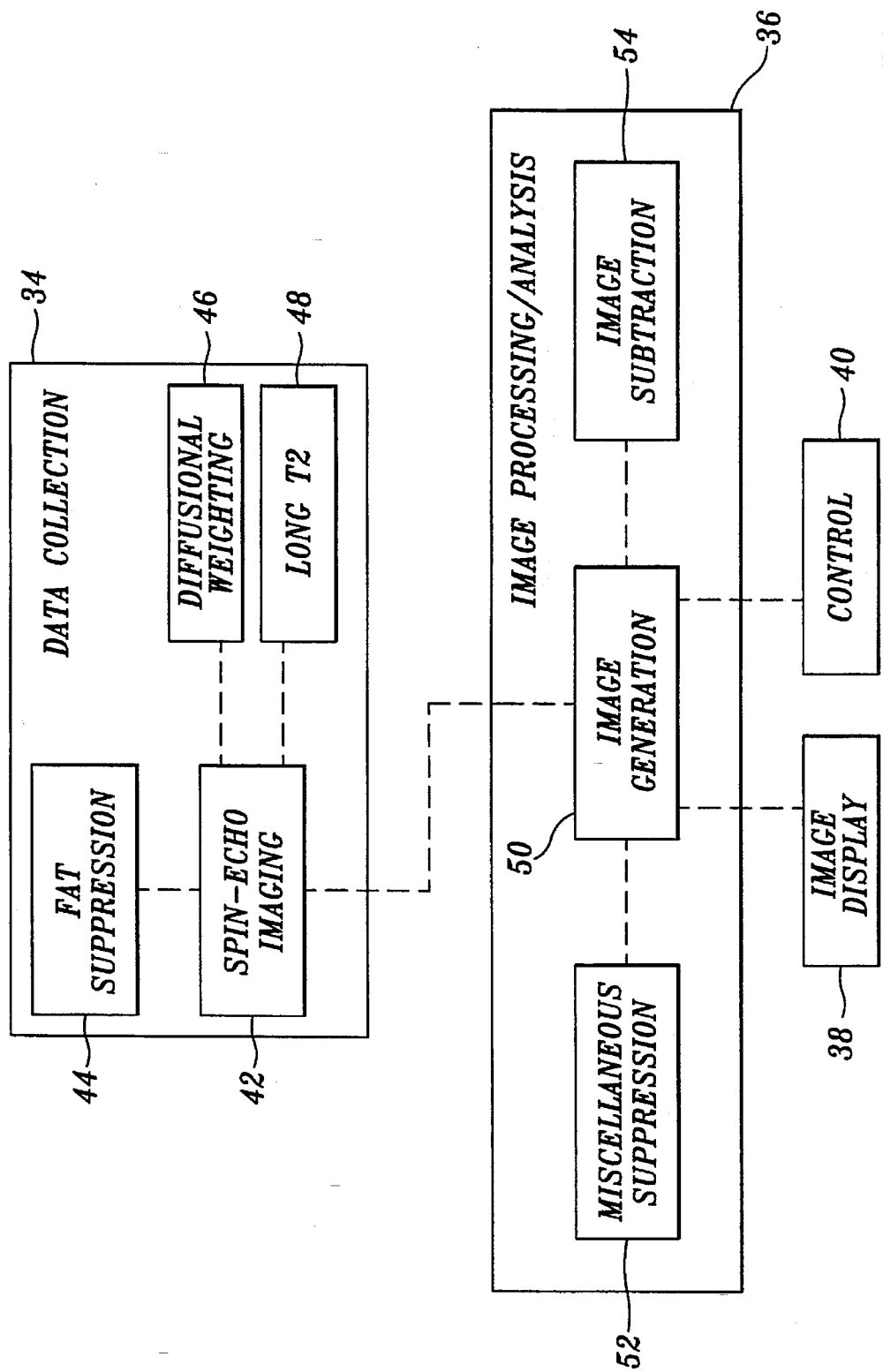
FIG. 7 is a functional chart of the operation of the neurography system of FIG. 6.

Turning now to a more detailed discussion of neurography system 10, by way of introduction, some of the more important operational features of system 10 are loosely depicted in the chart of FIG. 7. As will be described in greater detail below, system 10 may be constructed to employ one or more of these features to enhance the imaging ability of conventional MRI sufficiently to provide diagnostically and therapeutically useful information.

As shown, the operation of system 10 can be broken down into the broad steps of data collection 34, image processing and analysis 36, image display 38, and control 40. The data collection process 34 involves, for example, spin-echo imaging 42, which may be supplemented by one or more of the following imaging protocols: fat suppression 44, diffusion weighting 46, and "long T2" processing 48, and other protocols including magnetization transfer. Each of these protocols has been found to enhance the quality of images of peripheral nerve sufficiently to provide heretofore unavailable MRI neurograms.

The data collected by process 34 is subjected to image processing and analysis 36, involving two-dimensional and three-dimensional image generation 50. Image generation 50 may be further enhanced by miscellaneous suppression features 52, responsible for reducing the influence of, for example, blood vessels and patient motion, on the images produced. An image subtraction feature 54 may also be employed to remove all non-neural components from the images.

a. Neurography System Construction

Having briefly summarized the operational aspects of neurography system 10, its construction and operation will now be considered in greater detail. In one embodiment, MRI system 14 includes an imager I of the type sold by GE Medical Systems, under the trademark SIGNA (software release 5.2).

Figure 8:
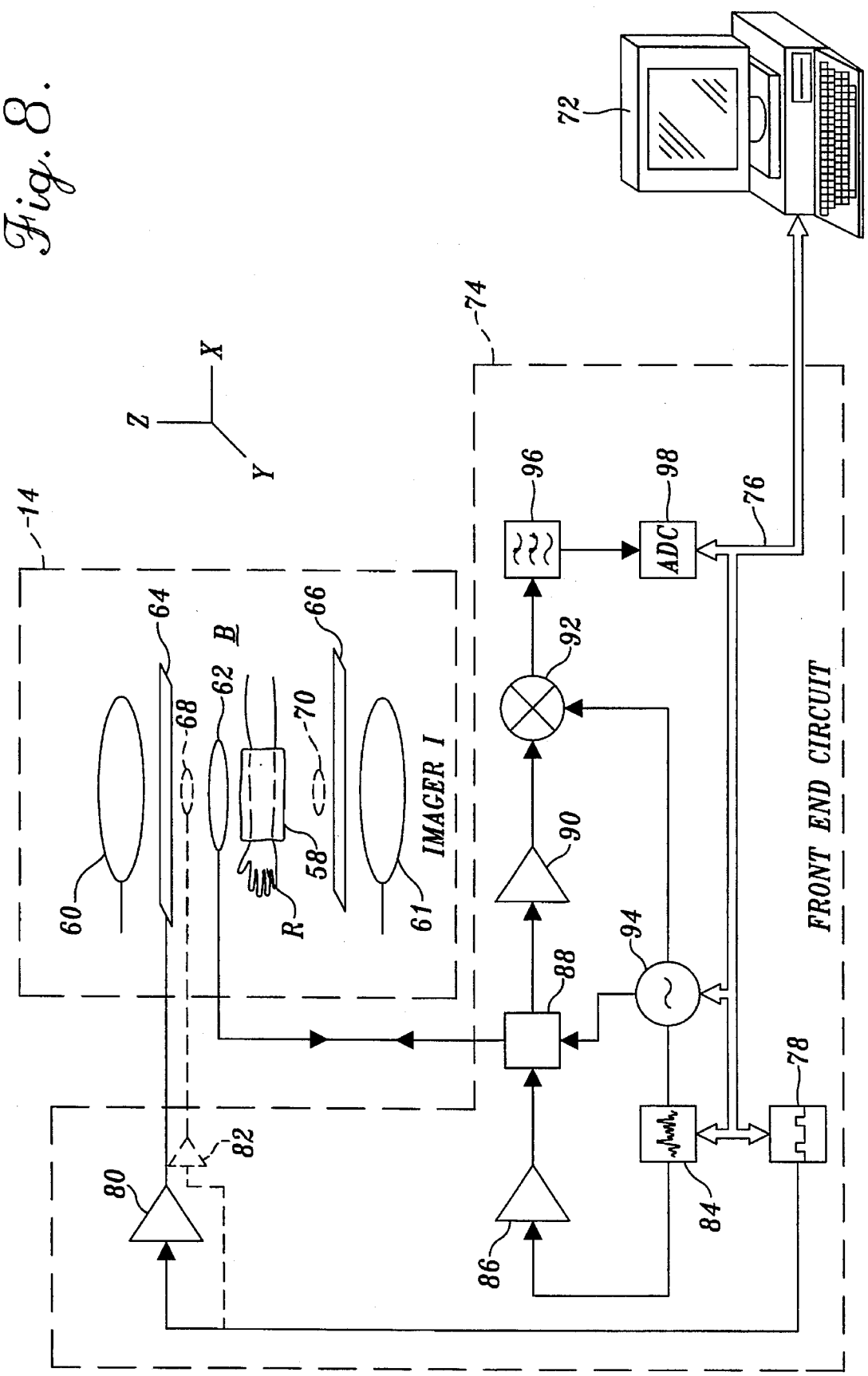
FIG. 8 is an illustration of the various components included in the neurography system of FIG. 6.

In that regard, as shown in FIG. 8, the region R of the patient to be imaged is placed within the bore B of the MRI system imager I. As will be described in greater detail below, the position of region R relative to the imager may be stabilized by a splint 58. Splint 58 limits motion artifact, provides fiducial markers in a secondary frame of reference, and reduces the system's susceptibility to boundary effects that otherwise might degrade fat suppression near the boundary between skin and air.

MRI system 14 includes polarizing field coils 60 and 61 responsible for exposing region R to the desired polarizing field. The polarizing field has a strength of, for example, 1.5 Tesla and is oriented along a z-axis.

A tuned rf excitation coil 62 is also positioned within bore B over the region R under investigation. Coil 62 is provided with a pulsed rf input, in a manner described below, to generate the field responsible for excitation of nuclear spins in region R. Coil 62 is also responsible for detecting the rf return, or echo, fields generated by the spins, although separate transmit and receive coils may alternatively be used.

The excitation coil 62 may be, for example, a solenoid or surface coil, configured and dimensioned to fit closely over the region R to be imaged (e.g., the patient's arm, leg, shoulder, chest, pelvis, head, neck or back). In a preferred arrangement, however, a phased array coil system is employed to increase the signal-to-noise ratio of the returns, thereby providing an improvement in the spatial resolution of system 14 and allowing information to be retrieved from signals that would otherwise have been too weak to form useful images. For example, where peripheral nerve having a thickness on the order of 1–2 mm is to be sharply resolved, each array includes, for example, 4–6 individual coils, arranged in transverse and longitudinal pairs or linear paired arrays.

Three pairs of gradient coils 64 and 66 are also positioned within the bore B of the imager. These coils superimpose a locational gradient of roughly one Gauss per centimeter upon the polarizing field over the sample region R along each of the x, y, and z-axes. For the sake of simplicity, however, only the z-gradient coils 64 and 66 are shown in FIG. 8.

In the preferred arrangement, the same coil pairs 64 and 66 are used to produce diffusional gradients along the desired axes, as well as the requisite locational gradients. Alternatively, one or more separate diffusional gradient coil pairs 68 and 70 may be provided within the imager bore B. If the separate coil pair 68 and 70 is mounted on a movable track, substantially any desired diffusional gradient orientation can be achieved. The diffusional gradient is relatively strong compared to the locational gradients, e.g, ranging up to 10 Gauss/centimeter or higher.

A computer 72 and front-end circuit 74 form the processing system 16, input system 18, and output/display system 20 of neurography system 10 shown in FIG. 6. Computer 72 and circuit 74 cooperatively control and synchronize the operation of MRI system 14, as well as process and display the acquired data.

The computer 72 is, for example, an IBM-compatible personal computer including a 486 processor, VGA monitor, and keyboard. An interface bus 76, included in circuit 74, couples computer 72 to the other components of circuit 74.

A gradient pulse generator 78 included in circuit 74 produces generally rectangular output pulses used to establish the desired gradients in the polarizing field. The output of generator 78 is applied to x-, y, and z-axis gradient field amplifiers 80, although only the z-axis amplifier 80 is shown in FIG. 8. As will be appreciated, if separate coils 68 and 70 are employed to establish the diffusional gradients, the output of generator 78 must be applied to those coils via separate amplifiers 82.

Circuit 74 also includes an rf pulse generator 84, which produces rf signal pulses used in the establishment of the excitation field. In the preferred arrangement, the pulse generator produces an rf output suitable for use in proton MRI, although frequencies specific to other MRI susceptible nuclei, such as, $^{19}$fluorine, $^{13}$carbon, $^{31}$phosphorus, deuterium, or $^{23}$sodium, may be used. The output of generator 84 is amplified by a high-power rf amplifier 86 before being selectively applied to the excitation coil 62 by a duplexer 88. The duplexer 88 is also controlled to selectively steer the low level MR returns received by the excitation coil 62 to a preamplifier 90.

A mixer 92 transforms the high frequency output of preamplifier 90 to a low frequency signal by mixing the amplified MR returns with signals from a digitally controlled rf oscillator 94, which also provides inputs to generator 84. The analog output of mixer 92 is input to a low pass filter 96 before finally being converted to a digital form by an analog-to-digital converter 98. The computer 72 processes the resultant digital inputs, which represent the response of the spins to the applied fields, to generate the desired neurograms.

b. Neurography System Operation

Figure 9:
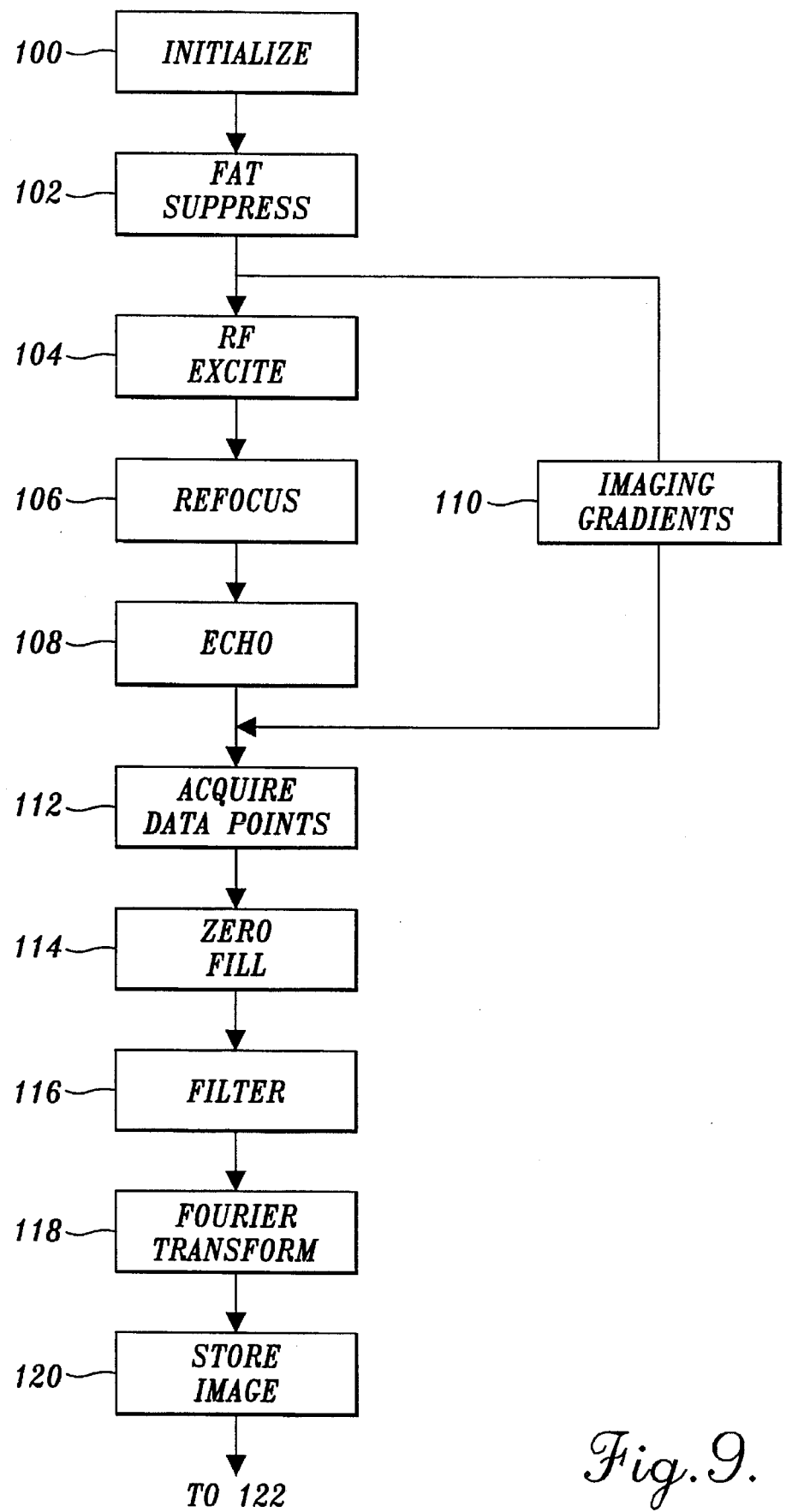
FIGS. 9 and 10 are flow charts depicting one way in which the neurography system of FIG. 8 may be used to generate neurograms.
Figure 10:
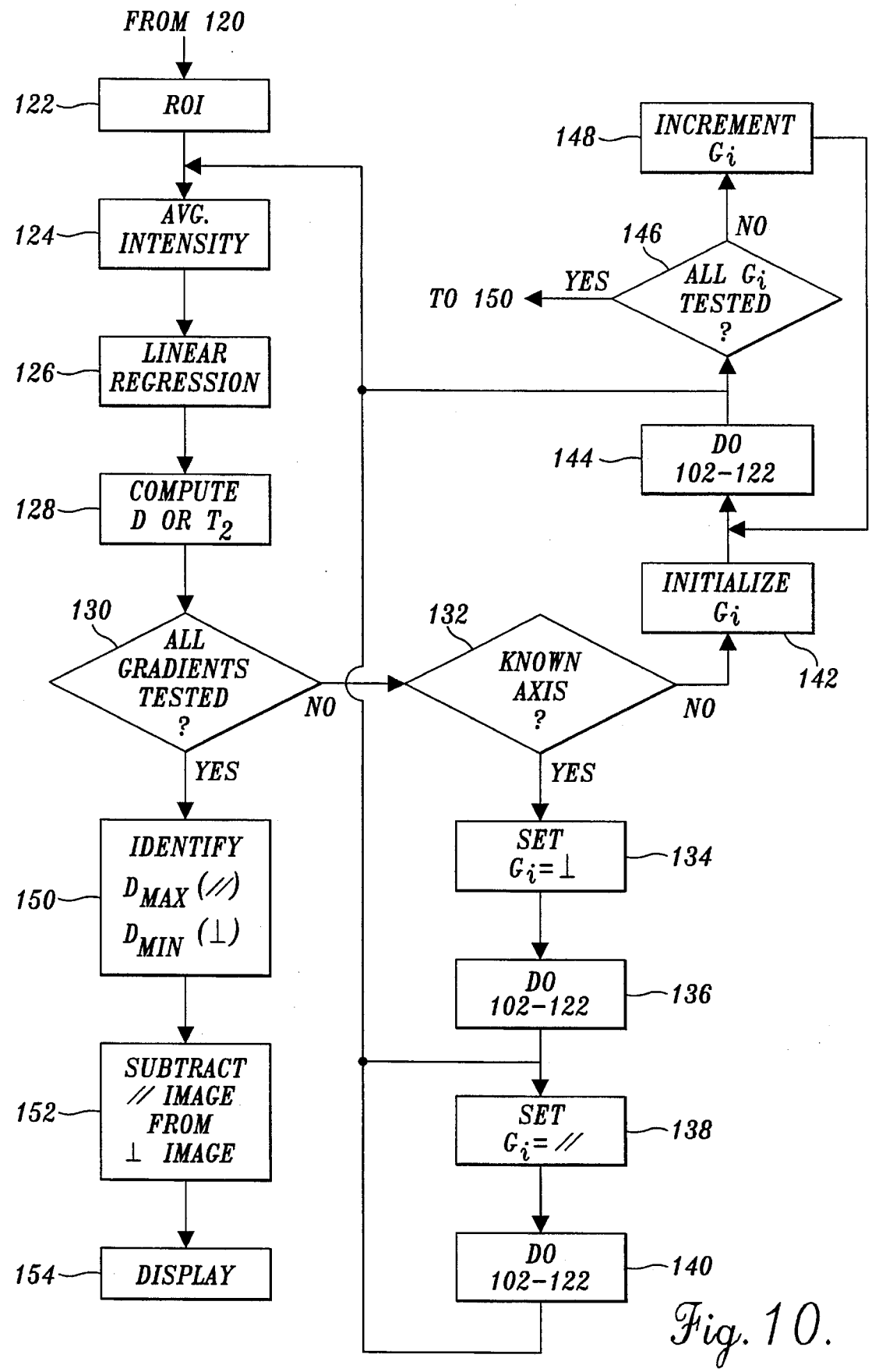
Figure 14B:
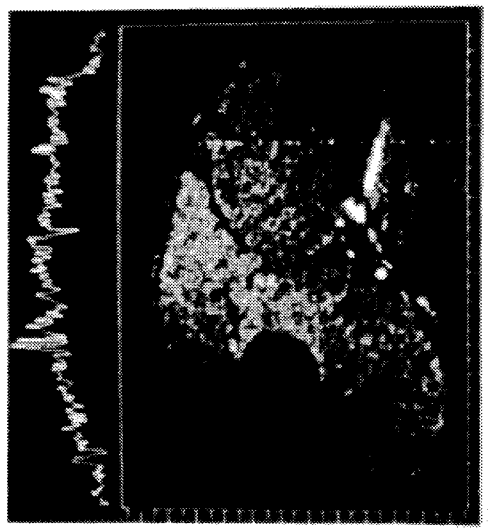
FIGS. 14A through 14D are images of the upper forearm of a rabbit produced employing gradients of 0, 3, 5, and 7 Gauss/centimeter, respectively.
Figure 14D:
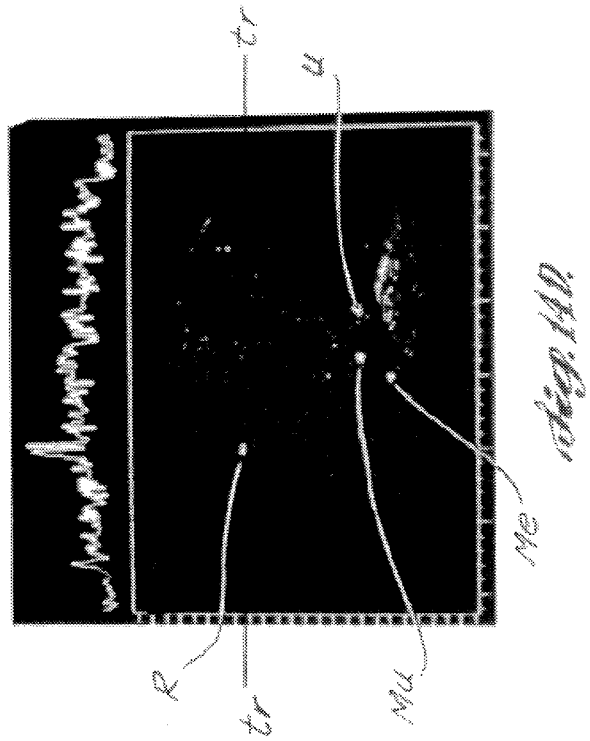
Figure 14A:
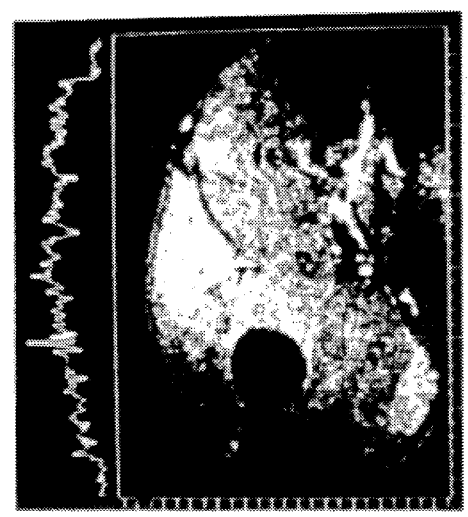
Figure 14C:
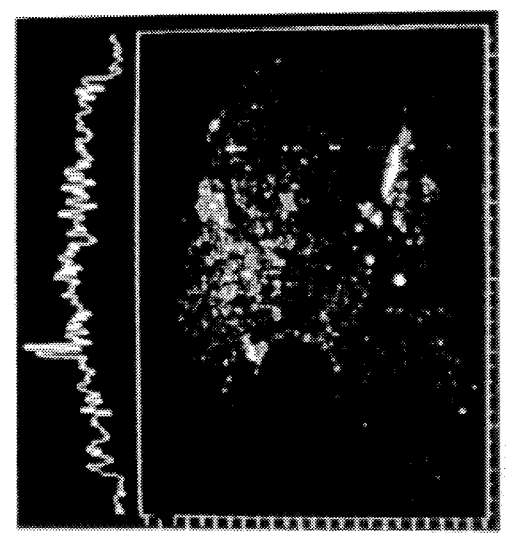

Having reviewed the basic construction of the neurography system 10, its operation to generate the desired two- or three-dimensional neurograms will now be considered. To that end, FIGS. 9 and 10 depict the general sequence of steps performed by system 10 in the production of neurograms. These neurograms exhibit a high nerve conspicuity, which for the purpose of the ensuing discussion will be understood to refer to the contrast (in, for example, intensity or color) between the nerve and the image background. The methods described below may be used to produce neurographic images of substantially any region of the body, including the brain, for example, central nervous system (CNS) neurograms.

As indicated at block 100, the operation of the system is first initialized to establish certain parameters of the system's operation. In that regard, the operator may input desired parameters via computer 72 in response to queries generated at start up. Because most aspects of the system's operation are controlled by software resident in the memory of computer 72, default initialization parameters may also be accessed.

Although the particular parameters to be initialized may vary at the user's discretion, examples include the type of images to be generated (i.e., two-dimensional cross sections or three-dimensional projections), field of view (FOV), thickness of each slice imaged, pulse repetition rate (TR), number of phase encoding steps, the existence of a known axis of diffusional anisotropy, and the strengths and orientations of the diffusional gradients to be used. By way of example, the operator may select a two-dimensional image, a FOV of four cm by four cm, a TR of 1.5 seconds, and 256 phase encoding steps. A discussion of anisotropic axis identification is provided below.

Once initialization has been completed, a series of steps, corresponding to the data collection process 34 discussed in connection with FIG. 7, are performed. This process generally involves the control of pulse sequences used in connection with front end circuit 74. As will be described in greater detail below, different sets of pulse sequences and combinations of pulse sequences have been devised to unambiguously distinguish small peripheral nerves from neighboring structures of similar shape and location, including the combination of certain existing sequences into new groupings for use in new situations and the design of new sequences that incorporate optimized features for the purpose of neurographic imaging. For illustrative purposes, a graphic illustration of one example of a suitable pulse sequence is provided in FIGS. 11A through 11F.

i. Fat Suppression

As indicated in block 102 of FIG. 9, a first, optional, step performed in the image generation process is fat suppression. Although fat represents a known source of interference in MRI images of bone and tissue, it was not previously recognized as an impediment to effective neural imaging due to the broader perception that neural MR signals were inadequate for imaging regardless of background composition. The value of fat suppression was discovered during the development of the present invention by the fortuitous use of a main field magnet designed for spectroscopy as part of an imaging system.

In that regard, in MR spectroscopy, a relatively strong magnetic field is employed to increase the separation in frequency between signals arising from different chemical species of the same nucleus, thereby allowing these components to be more easily distinguished. MRI also uses a frequency distribution (created by applying a field gradient) over a sample to locate spins and create an image. The signals from fat and water are at slightly different frequencies and therefore appear shifted relative to each other in an image.

The fat/water shift is relatively small when a low field, clinical MRI system is used. Fortuitously, a much stronger spectroscopic field magnet was used during initial efforts at imaging nerve, introducing a much greater displacement of fat in the image produced. With the high intensity fat signal shifted away from the nerve, an enhancement of the nerve's conspicuity was observed. The recognition of this enhancement led to the realization that effective neural imaging could, in fact, be achieved through the inclusion of fat suppression in system 14.

Fat suppression apparently enhances the use of conventional MRI systems for neurography in several ways. First, the removal of extraneous components reduces the number of imaged structures to be distinguished. Second, in a fat suppressed image a peripheral nerve exhibits a relatively high intensity and will stand out sharply against the low intensity space left behind by the suppressed fat. As will be described in greater detail below, fat suppression also synergistically increases the apparent magnitude of diffusion anisotropy and magnetization transfer effect.

One suitable fat suppression technique involves the use of a chemical shift selective (CHESS) pulse sequence, described in detail, for example, in Haase et al. *NMR Chemical Shift Selective Imaging*, 30 PHYS. MED. BIOL. 341–344 (1985).

As shown in FIG. 11A, CHESS involves the application of a sequence of narrow band rf pulses A, B and C to the excitation coil 62 to selectively excite the nuclear spins of fat molecules within the region R of the patient being imaged. By way of example, three millisecond Gaussian pulses having a minus three dB bandwidth of 600 Hertz may be employed. A sequence of gradient pulses a, b, and c is then applied to the three sets of gradient coils 64 and 66 to dephase the excited spins, thereby minimizing the contribution of the fat signals to the final image. The gradient pulses a, b, and c applied to the orthogonal gradient coil pairs produce, for example, gradients of five Gauss per centimeter for three milliseconds along the x, y, and z-axis, respectively.

FIG. 12 illustrates the effect of fat suppression on neurograms produced with the MRI system 14. The image provided in FIG. 12 is of the forearm of a rabbit and corresponds to the images of FIGS. 1–5 described above. The darker portions of the image represent greater image intensity. As shown in FIG. 12, the ulnar nerve UN and median nerve MN are readily identified.

As an alternative to the use of CHESS for fat suppression, the desired suppression may be effected by selective water stimulation. Other suitable alternatives include the Dixon technique for fat suppression described in, for example, Dixon et al., *Simple Proton Spectroscopic Imaging*, 153 RADIOLOGY 189–194 (1984) and also STIR (short tau inversion recovery) described in *Improved Fat Suppression in STIR MR Imaging: Selecting Inversion Time through Spectral Display*, 178 RADIOLOGY 885–887 (1991).

Although in the preferred embodiment fat suppression is combined with other techniques such as diffusional weighting and long $T_2$ processing, fat suppression by itself enhances conventional MRI processing sufficiently to generate clinically useful neurograms. Similarly, as will be described in greater detail below, other techniques employed by system 10 can be used without fat suppression to generate suitable neurograms.

ii. Spin-Echo Sequence (Without Diffusional Weighting)

Having discussed the optional introductory portion of the illustrative pulse sequence depicted in FIG. 11, the next phase of the neurography system's operation will now be considered.

In that regard, an rf excitation pulse D, shown in FIG. 11A, is applied to coil 62 to tilt the net magnetic moment of the spins by ninety degrees relative to the polarizing field, into the transverse plane. The resultant maximum transverse magnetization then decays to zero as the spins dephase. A second pulse E, having twice the intensity of pulse D, is applied to coil 62 after a delay of one-half the return or echo time (TE). This pulse rotates the spins a further 180 degrees and causes a spin-echo to form as the spins rephase. The spin echo has a maximum amplitude after a further delay of TE/2. A spin-echo signal F is, thus, generated in coil 62 at time TE in response to the combined influence of excitation pulse D and refocusing pulse E. These steps are depicted in blocks 104, 106, and 108 of FIG. 9.

At the same time, the imaging gradients are produced by the orthogonal coil pairs 64 and 66 to encode the echo signal F in the usual manner, allowing an MR image to be constructed, as indicated in block 110. With the sample oriented along the z-axis, the "slice select" pulses d, d', and e shown in FIG. 11C are applied to the z-axis coil pair 64 and 66, to excite and refocus the z-axis slice of interest. The "readout gradient" pulses f and f, shown in FIG. 11D, are applied to, for example, the x-axis coil pair 64–66 to achieve the desired output that is to be Fourier transformed. The "phase encoding" pulses g and g', shown in FIG. 11E, are applied to the y-axis coil pair 64 and 66, to control the number of echoes (e.g., 256) to be received. The sequence may be used to generate images from contiguous slices or regions of the patient.

As will be appreciated, if the operator indicates (at block 100) that diffusional weighting is not required for the generation of a particular image by neurography system 10, the pulses shown in FIGS. 11A–11E define substantially the entire spin-echo sequence. Even if diffusional weighting is to be employed, in the preferred embodiment an initial image is generated using only fat suppression for enhancement and, as a result, diffusional weighting is not used during the first performance of the spin-echo sequence (blocks 104–110) for a particular slice.

Although spin-echo imaging is employed in the preceding embodiment of neurography system 10, other techniques can be employed. Suitable alternative techniques include, for example, stimulated echo imaging and gradient-recalled echo imaging, e.g., echo planar imaging (EPI). Such alternative techniques are described in Parikh, MAGNETIC RESONANCE IMAGING TECHNIQUES (1992).

iii. Echo Processing

In the imaging sequence depicted in FIG. 11, a series of echo signals F are acquired to create a two-dimensional image. For example, at block 112 in FIG. 9, 256 echoes with 256 different phase encoding gradient amplitudes are used to construct a 256-by-256 pixel image. The data set is then enlarged at block 114 by zero filling to produce a 1024-by-1024 matrix of data. As a result, the apparent resolution of the final image is increased, making the image clearer.

Next, the enlarged data set is processed using a 2D Gaussian filter at block 116. The filter smoothes the image by attenuating the high frequency components in the image and, thus, clarifies the delineation of small details without altering the relative average pixel intensities over a region of interest. At block 118, the two-dimensional matrix of data then undergoes a two-dimensional Fourier transform, which yields an image to be stored. If desired, the image may also be displayed on the computer monitor, although in the preferred arrangement this image is but one component used in a more extensive analysis performed to generate a select, enhanced image.

Once an initial image has been generated, the analysis of the image is initiated, as shown in FIG. 10. At block 122, one or more regions of interest (ROI) within the image can be identified. Each ROI may be a single pixel or voxel, or a larger region. ROI selection can be performed manually using, for example, a keyboard or mouse to move a cursor over the ROI on the displayed image. Alternatively, ROI selection may be accomplished automatically via a sequential selection of all pixels or via an external input regarding a particular region from, for example, diagnostic system 24.

Next, the average image or pixel intensity within each ROI is computed at block 124. This average image intensity S can be represented by the following expression:

$$S = A_0 \, [\exp(-TE/T_2)][\exp(-bD)] \qquad (1)$$

where $A_0$ is the absolute signal intensity for a particular pixel and b is the gradient factor, determined in accordance with the expression:

$$b=\gamma^2(G_i^2)(\delta^2)(\Delta-\delta/3) \qquad (2)$$

where $\gamma$ is the gyromagnetic ratio, $G_i$ is the polarizing field strength, $\delta$ is the length of a diffusional weighting gradient pulse, and $\Delta$ is the interval between diffusional weighting gradient pulses. As will be appreciated, in the first iteration before diffusional weighting is employed, the final term of equation (1) is, thus, unity.

To make use of the expressions in equations (1) and (2), the preceding data acquisition process is repeated for different values of echo time TE. On the other hand, if diffusional weighting is employed, as described in greater detail below, the data acquisition process is repeated for different gradient strengths (controlled by adjusting gradient magnitude and/or duration) or gradient orientations. For example, TEs of 30, 60, 90, and 110 milliseconds, or gradient magnitudes of 0, 3, 5, and 7 Gauss/centimeter, may be employed. The image intensity S for a particular pixel of these multiple images of the same transverse slice for particular values of TE (or b, if diffusional weighting is employed) is available and a linear regression analysis of the logarithmic relationship is performed at block 126.

Finally, the value of the apparent $T_2$ relaxation time (or the apparent diffusion coefficient D, if diffusional weighting is employed) is computed for a particular ROI at block 128. These computations provide quantitative assessments of the various ROI in the image that are useful in subsequent image processing by other components of the medical system 12.

iv. Gradient Orientation for Diffusion Weighting

In the preferred arrangement, after the initial fat suppressed image has been collected and its ROI characterized, a diffusional weighting analysis is initiated to further enhance the neurograms generated by evaluating the diffusional anisotropy exhibited by nerve and other tissue. The first aspect of this analysis is the selection of the diffusional gradients to be used.

By way of introduction, in one currently preferred embodiment, the analysis involves the application of pulsed magnetic field gradients to the polarizing field in two or more directions to produce images in which the peripheral nerve is enhanced or suppressed, depending upon the "diffusion weighting" resulting from the particular pulsed gradient axis chosen. Discrimination of water diffusion anisotropy is then achieved by subtracting the suppressed image from the enhanced image, in the manner described in greater detail below, producing an image depicting only the peripheral nerve.

Most preferably, the magnetic field gradients are applied in mutually substantially orthogonal directions. For example, with gradients approximately perpendicular and parallel to the axis of the peripheral nerve at the particular point being imaged, the parallel gradient image can be subtracted from the perpendicular gradient image to produce the desired "nerve only" image.

As will be appreciated, if the axis of the nerve is generally known to the operator and its relationship to the referential frame of the MRI system 14 has been indicated at initialization block 100, the direction of the desired orthogonal diffusional weighting gradients can be readily determined. On the other hand, if the axis of the peripheral nerve is not known, or if many;nerves having different axes are being imaged, the neurography system 10 must employ a system of gradient orientations suitable for imaging nerve having substantially any axial alignment. For example, as will be described in greater detail below, a full three-dimensional vector analysis can be used to characterize the diffusion coefficient and provide a nerve image by construction based upon a fixed arrangement of diffusion weighting gradients.

In anatomical regions, such as the upper arm or wrist, it is also possible to achieve adequate enhanced isolation of the nerve image by applying only a single diffusion gradient perpendicular to the axis of the nerve at the site of interest. As a result, no subtraction need be carried out to produce the neurogram. The fat suppressed, orthogonally diffusion weighted image can either be processed directly, or it can be subject to threshold processing to remove signals of lower intensity associated with non-neural tissue, or nerves with different axes and directions of travel at the imaging location.

As will be appreciated, for quicker and more efficient data collection and processing, the establishment of diffusion gradients in the polarizing field should be responsive to the particular one of the foregoing scenarios that applies to the imaging problem at hand. Depending upon the inputs provided at block 100, the system may have been advised that (a) only one gradient of known orientation is required, (b) two orthogonal gradients of known orientation are required, or (c) two or more gradients of unknown orientation are required.

As indicated in block 130 of FIG. 10, upon completion of the analysis of an image, the system considers whether all of the desired diffusional gradients have been applied to the polarizing field during subsequent data acquisition by, for example, spin-echo processing, or fast spin-echo processing. Because no diffusional gradient was used in the initial fat suppression processing, the answer is initially NO and operation proceeds to block 132.

There, the computer determines whether the operator initially indicated that the axis of diffusional anisotropy is known. If the axis is known, a perpendicular diffusional gradient is employed, as indicated at block 134. Then, as indicated at block 136, a diffusion-weighted spin-echo sequence is performed (modified by the inclusion of the diffusional gradient in the manner described in greater detail below) and image generated, pursuant to blocks 102–122, before quantification of the image data occurs at blocks 124–128 to compute D or $T_2$. If the operator indicated at initialization that orthogonal diffusion gradients are required for the particular imaging problem at hand, this process is then repeated at blocks 138 and 140 for a parallel diffusional gradient.

If the inquiry performed at block 132 determines that the axis of diffusional anisotropy is unknown, operation proceeds to block 142. There an initial diffusional gradient is arbitrarily selected, to be followed by a sequence of alternative gradients selected for use by the operator when the anisotropic axis is unknown.

At block 144, using the initial diffusional gradient, a spin-echo sequence is performed (modified by the inclusion of the diffusional gradient in the manner described in greater detail below) and image generated, pursuant to blocks 102–122, before quantification of the imaged data occurs at blocks 124–128. Then, at block 146, a test is performed to determine whether the desired number of different diffusional gradients (e.g., three gradients, along the x-, y-, and z-axes) have been used. If not, the next diffusional gradient is selected at block 148 and the spin-echo sequence, imaging and processing operations are performed, as indicated at block 144. This process is then repeated until the desired number of alternative diffusional gradients have been employed.

As will be appreciated, additional gradient coils may be provided where gradients are desired along axes other than those provided by the locational gradient coils. To that end, diffusional gradient coils may be mounted on a magnetically compatible, adjustable track within the bore of the imager to allow gradients to be repositioned and applied over a substantially continuous range of orientations. Similarly, the region to be imaged may be movably supported relative to a fixed set of gradient coils to introduce the desired variability in gradient direction. As another option, a plurality of different gradient coils may be employed and activated in various combinations to effect the desired gradient variations. Alternatively, the results obtained from a limited number of gradient directions can be processed using a vector analysis to estimate the results obtainable with a gradients other than those directly available, as described in greater detail below.

v. Spin-Echo Sequence For Diffusional Weighting

As noted briefly above, for each of the different diffusional gradients employed, the spin-echo sequence is repeated, followed by the generation of image data and the processing of that data to, for example, quantify the relaxation time $T_2$ or diffusion coefficient D. In the preferred arrangement, the use of diffusion gradients influences a number of aspects of the spin-echo sequence.

As shown in FIG. 11F, two pulses h and h', applied to the desired pair of gradient coils are used to establish a particular diffusional gradient in the polarizing field. For an echo time (TE) of 50 milliseconds, the duration (δ) of each pulse is, for example, 10 milliseconds and their separation (Δ) is 20 milliseconds. In the presence of the diffusional gradient, the echo signal F, and therefore the pixel or voxel intensity in the image ultimately produced, is made sensitive to the spatial diffusion of water molecules in the imaged region R.

In that regard, as indicated above, with the diffusional gradient oriented substantially perpendicular to the diffusionally anisotropic nerve, the nerve image is enhanced and generally exhibits the highest intensity of various features imaged. This phenomena is depicted in FIG. 13A, which is an image of the forearm of a rabbit, corresponding to the diagram provided in FIG. 1. The ulnar nerve UN and median nerve MN are both relatively dark (high intensity) and are easily seen. Alternatively, with the diffusional gradient oriented substantially parallel to the diffusionally anisotropic nerve, the nerve image is suppressed and generally exhibits a lower intensity than other features imaged, as illustrated in FIG. 13B. These images can be combined, via a subtraction process described in greater detail below, to produce an image of the nerve isolated from all other structure.

To reduce the effect of cross-terms between the imaging gradients and the diffusion weighting gradients, the spin-echo sequence illustrated in FIG. 11 is a modified version of conventional sequences. More particularly, the readout gradient rephasing pulse f shown in FIG. 11D, is placed directly before the acquisition of echo F in FIG. 11A, instead of after the slice-selective excitation pulse d, shown in FIG. 11C. However, a consequence of this change was the appearance of artifacts in the non-diffusion-weighted images due to an unwanted echo, presumably formed from imperfections in the slice-selection pulses d, d', and e, shown in FIG. 11C. To overcome this problem, a second modification of the pulse sequence was made. Specifically, the phase-encoding gradient was split into two sections g and g', and two or four transients (depending upon S/N) were acquired with phase cycling. As a result, the remaining cross terms contribute less than three percent to the diffusion weighting factor.

Although fat suppression is not required to take advantage of the image enhancements available through diffusional weighting gradients, in the preferred arrangement, the fat suppression sequence shown in FIGS. 11A and 11B is employed prior to the initiation of the diffusion-weighted spin-echo sequence. As will be described in greater detail below, the combination of these techniques generally provides an image quality that exceeds that available from either technique individually.

The echo F produced using the diffusion weighted pulse echo sequence is processed in the manner described above in connection with blocks 112 through 128 of FIGS. 9 and 10. With diffusion weighting, the computation of the diffusional coefficient D at block 128 is preferably based upon the analysis of data collected for different gradient magnitudes. For example, the computation may be based upon gradients of 0, 3, 5, and 7 Gauss/centimeter, resulting in the production of image data as represented in FIGS. 14A through 14D, respectively. While fat, bone, marrow, skin and vessels are generally absent even at the lower gradients, muscle and ligaments drop out at the higher gradients. As suggested previously, the increasingly stronger gradients may be achieved by increasing gradient duration, rather than magnitude. Alternatively, the iterative data collection process may be performed using different gradient directions.

vi. Image Selection/Production

Once computer 72 determines, at block 130, that images have been collected for all of the desired diffusional gradients, operation proceeds to block 150. If the axis of anisotropy is unknown, the various diffusional coefficients D computed for each ROI using different gradient orientations are compared at block 150 to identify the maximum and minimum values. These coefficients provide a measure, associated with each pixel or voxel, of the magnitude of diffusional anisotropy at that point, while the anisotropic direction is indicated by the gradient orientation.

(a) Subtraction Neurography

In the preferred arrangement, the images associated with the maximum and minimum values of the diffusional coefficients for a particular ROI are then used in a subtraction process, as indicated at block 152. The image associated with the larger coefficient is produced by a gradient that is more nearly perpendicular to the neural axis, enhancing the nerve image, while the image associated with the smaller coefficient is produced by a gradient that is more nearly parallel to the axis, selectively destroying the nerve signal. When these two penultimate images are then mathematically (or photographically or optically) subtracted from one another, a subtraction neurogram is produced.

Figure 15D:
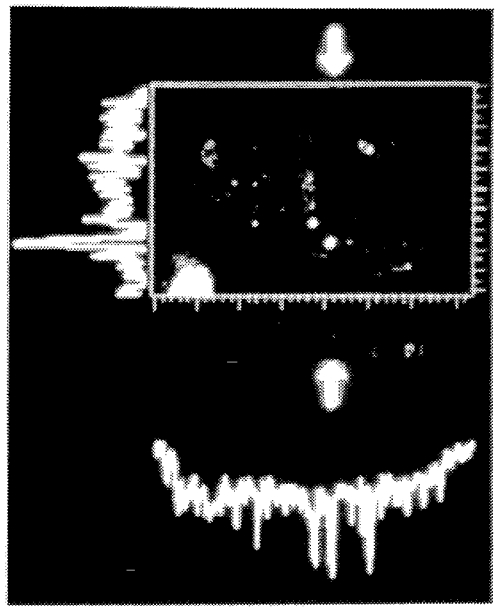
FIG. 15D is an image based upon the images of FIGS. 15B and 15C, referred to herein as a subtraction neurogram FIG. 16 vector length image of the brain produced using the neurography system of FIG. 8.
Figure 15B:
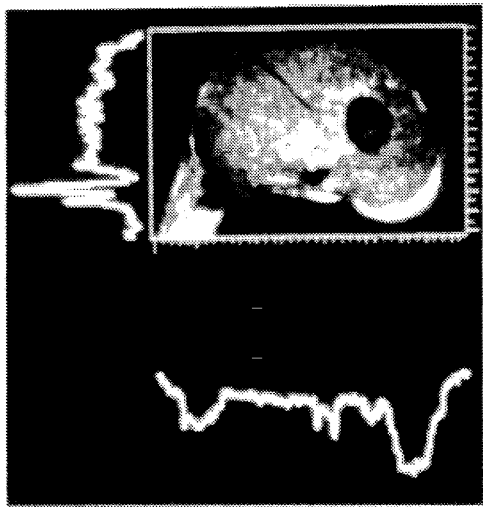
Figure 15C:
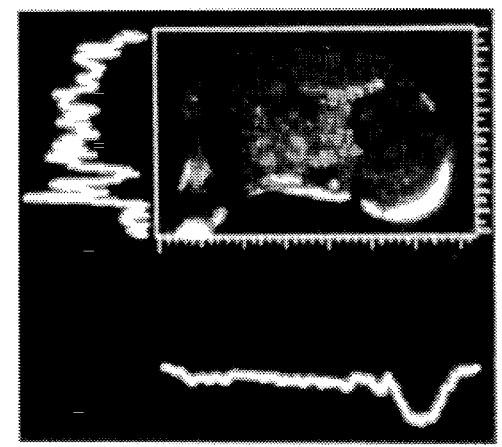
Figure 15A:
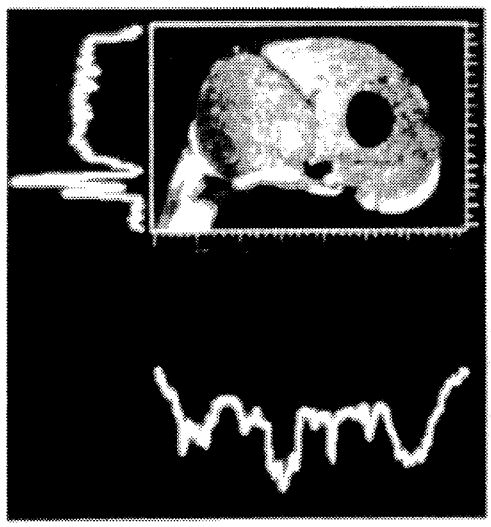

By way of illustration, FIG. 15A is an image produced without diffusion weighting. FIGS. 15B and 15C then illustrate images produced using parallel and perpendicular gradients, respectively. Finally, the subtraction neurogram produced when the image of FIG. 15C is subtracted from that of FIG. 15B is shown in FIG. 15D.

This "ideal" neurogram is somewhat analogous to a subtraction angiogram (an image showing only blood vessels), but sharply highlights a nerve rather than a vessel. Such an image is particularly useful for confirming the identification of nerves in a given imaging plane or space as well as for locating nerve injuries and nerve compressions. Despite the well known existence of angiograms showing the entire vascular pattern in an anatomic region, and despite the existence of MRI techniques that could have been applied to the problem of neural imaging techniques, and despite the great need for the visualization of nerves, particularly, in isolation, there has not previously been any way of creating such neurograms.

Although image subtraction is employed in the preferred arrangement, it is not necessary. For example, in some applications of known anisotropy, subtraction is unnecessary and can be foregone in favor of a threshold analysis. Also, the subtraction process can be further supplemented, if desired. For example, the output of the subtraction process can be divided by the signal information from a fat suppressed, $T_2$-weighted spin echo sequence (e.g. using the aforementioned CHESS technique).

One potential problem to be addressed by the use of the subtraction process is image registration. As will be appreciated, provided that non-neural tissue is identically located in both images subjected to the subtraction process, the non-neural component will cancel out of the resultant image. On the other hand, if some shift or other discrepancy in the apparent position of non-neural tissue is introduced into an image due, for example, to movement of the subject, cancellation may not occur and the nerve may actually be more difficult to identify in the resultant image.

In one embodiment, acceptable image registration is evaluated prior to initiation of the subtraction process. More particularly, the intensities of pixels in one image are compared to the intensities of corresponding pixels in the second image. Pixels of neural tissue are disqualified on the basis of their high diffusional anisotropy, assessed via their diffusion coefficients. Unless the intensities of the remaining, non-neural pixels fall within a certain range of each other, indicating acceptable image registration, subtraction will be inhibited.

(b) Vector Processing and Three-Dimensional Image Generation

Up to this point, the output produced is generally in the form of a single two-dimensional image, or a series of two-dimensional images that can be related to form a three-dimensional image. In a simple form of three-dimensional image generation, described in greater detail below, the high S/N ratio of the two-dimensional neurograms produced by system 14 readily allows the imaged nerve cross-sections to be identified and then linked together to form a three-dimensional projection of the neural structure.

As will be appreciated, however, depending upon the neural pattern involved and the spatial resolution required, this simplified approach may introduce undesired discontinuities into the three-dimensional projection. A more sophisticated processing scheme employs information about the anisotropic direction of the nerve in each two-dimensional image to further enhance the accuracy of three-dimensional image projections. The availability of information regarding anisotropic direction is also useful in establishing the optimal directions for the gradients used in the diffusional weighting analysis described above to produce a two-dimensional image.

In that regard, the anisotropic axis of the peripheral nerve being imaged is sometimes known to the operator, allowing the operator to input the directional information at block 100 and select the best diffusional gradients for imaging. More commonly, however, nerves and CNS neural tracts follow relatively complex paths and the direction in which the diffusion anisotropy coefficient of the nerve or tract is greatest gradually shifts from one plane or axis to another as the nerve or tract curves or turns. As a result, one or two arbitrarily oriented, standard gradients may be inadequate to provide the desired images.

Changes in neural direction can be monitored by moving the patient relative to a fixed set of gradient coils or employing movable diffusional gradient coils mounted, on a track with a non-magnetic drive system, within the bore of the imager to adjustably control the orientation of the diffusional gradients applied to the region of interest. By monitoring changes in the ratio of $D_{pl}/D_{pr}$ obtained for a given pixel using alternative gradient alignments, or for sequential pixels using the same gradient alignments, changes in neural direction can be estimated and suitable gradient directions selected. Alternatively, gradient coils oriented in three planes can be simultaneously activated in various combinations to achieve the effect of an infinite variety of differently oriented gradients.

One advantage of attempting to track changes in neural direction is that parallel and perpendicular gradient information can then be collected and used to produce a subtraction neurogram of the type described above. If, however, the optimal gradient directions for a given pixel are determined using feedback from images generated with repetitively adjusted gradients, processing speed may be significantly impaired.

In many cases the well known anatomy of a nerve will permit the use of a particular axis orientation in advance. Initial imaging information will provide a description of the gross course of the nerve. A subsequent "informed" approximation can optimize the orientation in each slice. This can be useful to insure excellent homogeneity of nerve image intensity or to measure the coefficient of anisotropy along the course of the nerve.

As a preferred alternative, requiring less mechanical complexity and faster processing speed, a technique has been developed for observing diffusional anisotropy, independent of its degree of alignment with any individual gradient axes. This process involves the combination of information from anisotropy measurements obtained along three standard orthogonal axes or using information from multiple fixed axes. For example, in the preferred embodiment, a vector analysis is used to produce interpolated images and directional information from the three orthogonal diffusion-weighted images described above.

In that regard, image information is collected from, for example, four "multi-slice" sets using a zero diffusion gradient $B_0$ and diffusion gradients $B_x$, $B_y$, $B_z$ in the x-, y-, and z-orthogonal directions, respectively. For each pixel in the image to be produced, information concerning the corresponding pixels in the four diffusion gradients images is combined to produce a diffusion vector, representative of water molecule movement along the nerve fiber in either direction. This vector has a magnitude representative of the image intensity of the pixel and a direction representative of an "effective" diffusion gradient associated with the pixel.

More particularly, the image intensity $S_n$ of a given pixel in the new image is calculated using the following vector equation:

$$S_n = \text{vector length} = [(S_x^2 + S_y^2 + S_z^2)S_o^2]^{1/2} \quad (3)$$

where $S_x$, $S_y$, and $S_z$ are the image intensities of the corresponding pixels in the images produced by the $B_x$, $B_y$, and $B_z$ gradients. $S_0$ is the image intensity of the corresponding pixel in the image produced by the $B_0$ gradient and is included in equation (3) to normalize the resultant image intensity $S_n$. The direction of the effective gradient associated with this pixel image includes components $\theta_{xy}$, $\theta_{xz}$, and $\theta_{yz}$, computed in the following manner:

$$\theta_{xy} = \text{diffusion vector angle between } B_x \text{ and } B_y = \arctan(S_y/S_x) \quad (4)$$

$$\theta_{xz} = \text{diffusion vector angle between } B_x \text{ and } B_z = \arctan(S_z/S_x) \quad (5)$$

$$\theta_{yz} = \text{diffusion vector angle between } B_y \text{ and } B_z = \arctan(S_y/S_z) \quad (6)$$

The parameters computed in equations (3), (4), (5), and (6) can be used to generate images in a variety of different ways. For example, the intensities of the pixels can be displayed as a "vector length" image. An illustration of a vector length CNS image, in which the intensity of the image is proportional to the magnitude of $S_n$ is shown in FIG. 16.

Figure 16:

The image of FIG. 16 is a brain scan of a monkey (macaca fascicularis) weighing 2–2.5 kg, performed using diffusion imaging (spin-echo) on a General Electric CSI II imager/ spectrometer (2 Tesla, equipped with actively shielded gradients). The acquisition parameters were: TR=1000 ms, TE=80 ms, diffusion gradients=5 Gauss/cm, diffusion gradient duration=20 ms, diffusion gradient separation=40 ms. Four slices of thickness 4 mm were imaged. $T_2$-weighted images were used to reproducibly select the diffusion images.

As an alternative to the use of vector length images, arctan images can be employed. These images are obtained by establishing the intensity of a pixel in direct proportion to the angular output of one of equations (4), (5), or (6). An illustration of an arctan image is provided in FIG. 17. As shown in this example of a CNS neurogram, a select neural tract of interest can be effectively traced and made to stand out in isolation from other neural tracts.

Figure 17:
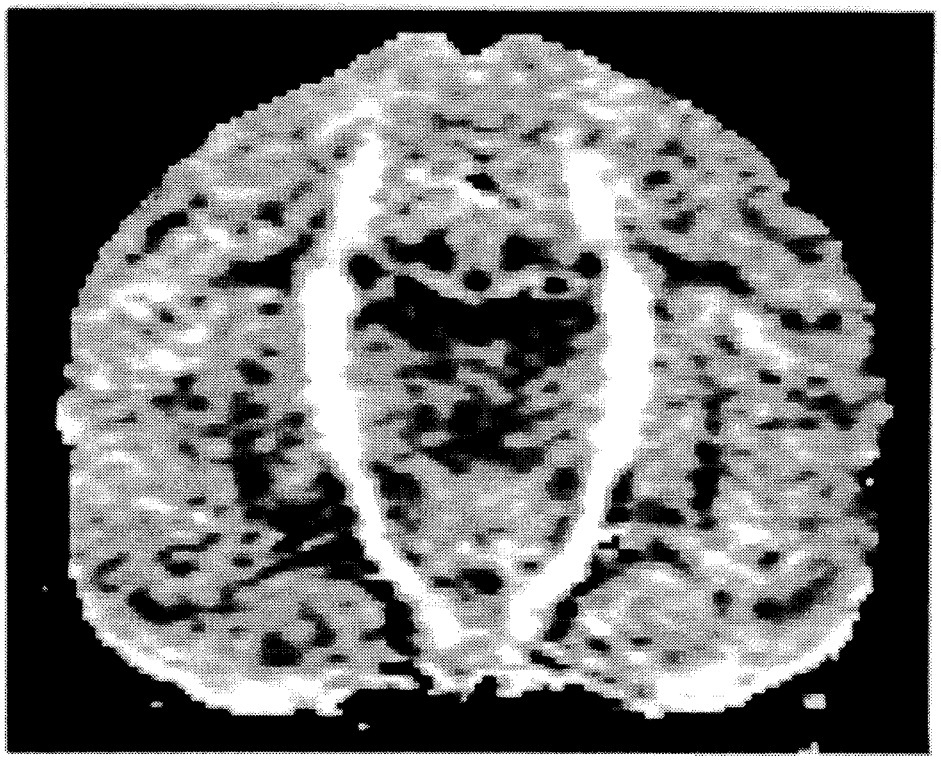
FIG. 17 is an arctan image of the brain produced using the neurography system of FIG. 8.
Figure 18B:
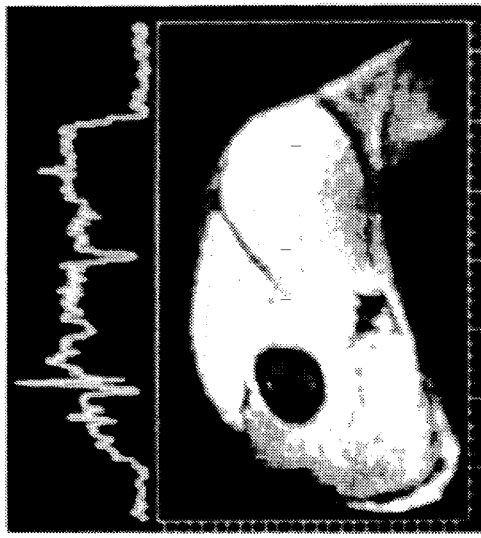
FIGS. 18A through 18D are images of a rabbit forearm produced using the neurography system of FIG. 8, and illustrating the influence of the TE sequence upon the images produced.
Figure 18D:
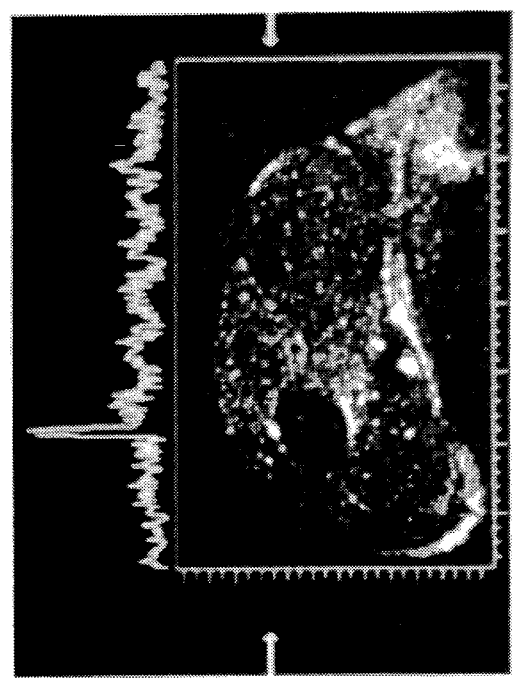
Figure 18A:
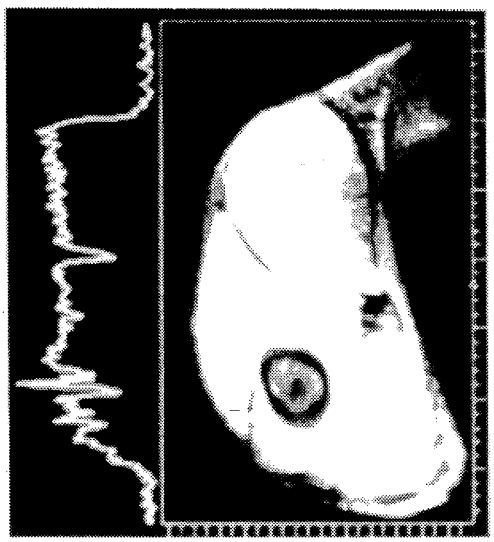
Figure 18C:
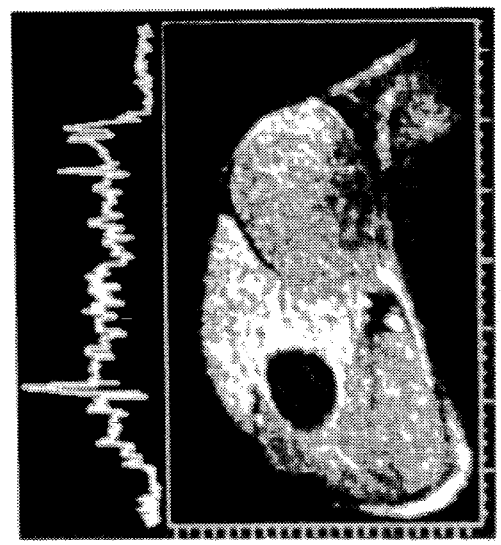

When used to evaluate lesions in CNS images of the type shown in FIGS. 16 and 17, vector length images will be more sensitive to water diffusion changes where all three orthogonal images change in the same way, while the vector angle images will be sensitive to changes in anisotropy between two orthogonal directions. A CNS lesion caused by experimental allergic encephalomyelitis induced by myelin basic protein is demonstrated by its departure from the diffusional anisotropy, which appears as vector length decreases and image intensity changes accentuated in particular vector angle images.

Alternative forms of vector analysis can also be applied, for example, as described in Basser et al., *Fiber Orientation Mapping in an Anisotropic Medium with NMR Diffusion Spectroscopy*, SMRM BOOK OF ABSTRACTS 1221 (1992). Similarly, tensor analyses employing tensors of various ranks, as described in Basser et al., *Diagonal and Off Diagonal Components of the Self-Diffusion Tensor: Their Relation to an Estimation from the NMR Spin-Echo Signal*, SMRM BOOK OF ABSTRACTS 1222 (1992), can be used to treat, or transform the coordinates of, MR diffusional anisotropy data. Suitable alternative processing techniques have been developed for use in the evaluation of magnetic, thermal, and structural anisotropy data.

Unlike prior art systems, because the non-neural components of the neurograms produced by system 14 exhibit a relatively low intensity, or indeed disappear entirely from the images, the computer 72 is readily able to identify nerve locations in the anatomical structure and to correctly trace the course of the nerves between two-dimensional image planes or through a three-dimensional acquisition volume. For example, the location of nerves in a given image plane can be detected by comparing pixel intensity to some threshold level. A three-dimensional image can then be formed by linking or projecting the results of these two-dimensional analyses over the desired volume.

As an alternative, the vector information obtained above can be used to track continuous serial changes in the direction of maximum anisotropy of a nerve or neural tract as the nerve or tract travels along its natural course. In that regard, the direction of maximum anisotropy for each voxel associated with a nerve is determined and a voxel connection routine, of the type described in Saloner et al., *Application of a Connected-Voxel Algorithm to MR Anglographic Data*, 1 JOURNAL OF MAGNETIC RESONANCE IMAGING 423–430 (1991), is then used to link up voxels of maximum anisotropy. The resultant plot of the nerve or neural tract provides enhanced spatial resolution and less discontinuity from one image plane to the next.

As an alternative to the two-dimensional imaging sequences described above, it is also possible to carry out the signal acquisition using a "three dimensional" imaging sequence of the type described in Frahm et al., *Rapid Three-Dimensional MR Imaging Using the FLASH Technique*, 10 JOURNAL OF COMPUTER ASSISTED TOMOGRAPHY 363–368 (1986). The output of this sequence is then processed using a three-dimensional Fourier transform to extract the returns from nuclei over the volume being imaged. The resultant processing used to compute D for a given voxel and to generate, for example, a subtraction angiogram is substantially the same as described above.

Regardless of the routine employed to project the neural structure in three-dimensions, the system 10 may be further programmed to implement the projection by referring to known characteristics of the structure. More particularly, once a given nerve has been identified in a given two-dimensional image, an "expert" system 10 is able to predict the occurrence of certain branches and mergers in this structure, albeit at unknown locations. This information can then be used to test the plausibility of the projection being generated, refining it where necessary.

vii. Results of Combined Fat Suppression and Diffusion Weighting

As previously noted, both muscle and nerve exhibit diffusional anisotropy. In view of the relatively low signal strength of neural components, diffusional analyses were not expected to provide clinically useful neurograms. The combined use of fat suppression and diffusional weighting has, however, been found to be extremely effective in providing the desired nerve image enhancement.

By way of illustration, for a gradient strength of 7 G/cm and an echo time of 50 ms, an nerve image signal intensity ($S_n$) of 17 and a muscle image signal intensity ($S_m$) of 7 were calculated, based upon the difference between signal intensities with pulsed gradients oriented perpendicular and parallel to the nerve. A nerve-to-muscle contrast parameter R of 2.43 was then computed as the ratio $S_n/S_m$. Similarly, a comparison of the apparent diffusion coefficients for diffusional gradients perpendicular ($D_{pr}$) and parallel ($D_{pl}$) to nerve and muscle are as follows:

| Apparent Diffusion Coefficients ($10^{-5}$ cm$^2$/sec) | | |
|---|---|---|
| | Muscle | Nerve |
| $D_{pr}$ | 1.17 | 0.65 |
| $D_{pl}$ | 2.18 | 2.00 |
| $D_{pl}/D_{pr}$ | 1.9 | 3.1 |

These results clearly illustrate that the neural components exhibit a far larger relative change in intensity than muscle components when subjected to diffusion anisotropy analysis.

An unexpected and apparently synergistic benefit of fat suppression, when used in combination with diffusional weighting, is that an actual increase in neural signal anisotropy is experienced, with the conspicuity of the neural component of the image increasing by roughly 250 percent when the fat component is removed. The combined increase in nerve conspicuity and reduction in fat interference significantly enhances the effectiveness of neural imaging.

Although not entirely understood, there are several potential explanations for the synergistic relationship between fat suppression and diffusional weighting. First, it appears that fat suppression may increase the apparent diffusional anisotropy of nerve, enhancing the utility of diffusional weighting gradients in the detection of neural tissue. By way of illustration, an indicated in the following test data, obtained with the signal from fat and "short $T_2$" water removed, the intensity of the remaining image signal was due largely to anisotropically diffusing water.

| Nerve Imaged | CHESS Applied Gradient Direction | | | CHESS Not Applied Gradient Direction | | |
|---|---|---|---|---|---|---|
| | pr | pl | Ratio | pr | pl | Ratio |
| Ulnar Nerve | 29 | <8 | >3.6 | 62 | 49 | 1.3 |
| Median Nerve | 30 | <8 | >3.8 | 46 | 22 | 2.1 |
| Muscle | 14 | 8 | 1.8 | 18 | 12 | 1.5 |

The synergistic role of fat suppression can also be viewed as a demonstration of a magnetization transfer effect. More particularly, the irradiation of protons on e.g,. myelin lipids surrounding the nerve by the saturation pulse of the fat suppression sequence may allow transfer of the saturation pulse to water molecules in close association with the lipid, allowing for very efficient transfer. Subsequently, these molecules can exchange into the anisotropically diffusing mobile water pool.

vii. Long TE/TR/$T_2$ Processing

As an alternative to the use of diffusional gradients described above, in some regions of interest, it is possible to achieve adequate enhanced isolation of the nerve image by use of a spin echo fat suppression technique with a relatively long TE (echo time) or TR (repetition time) to achieve a $T_2$-weighted image. In that regard, after fat suppression, the dominant component remaining in the echo F is returned from muscle. Because the $T_2$ of peripheral nerve has been measured by the inventors to be roughly twice as long as the $T_2$ of muscles, the use of a relatively long TE or TR in the spin echo sequence allows the muscular return to be removed.

The basic operation of a neurography system 14 employing this feature remains the same as that shown in FIGS. 9 and 10 except that the initialized value for TE is extended. In that regard, the operator may be called upon to initially consider whether the desired imaging is likely (e.g., neural imaging in a patient's limbs) or unlikely (e.g., CNS imaging) to be disrupted by the presence of muscle. If muscular interference is likely, a relatively long TE of between 50 and 100 milliseconds or even longer is initialized at block 100. The particular TE or TR selected depends upon the degree of $T_2$ weighting desired. Alternatively, the system 14 may be programmed to compare the imaging data separately collected using long TE processing and diffusional weighting to assess which provides the best results.

Illustrations of the results available with long TE imaging are provided in FIGS. 18A through 18D, for TE equal to 30, 40, 60, and 100 milliseconds, respectively. In the image of the forearm of a rabbit, provided in FIG. 18D, produced with a field strength of 4.7 Tesla, nerves are brighter than any other structure in the image. The extent of the increased nerve conspicuity is on the order of ten-fold, rendering the images clearly susceptible for use in constructing neurograms. As will be appreciated, lesser conspicuities on the order of 1.1 may also be useful.

The use of extended TE processing had previously been considered unfeasible. In that regard, as described in Moseley et al., *Anisotropy in Diffusion-Weighted MRI*, 19 MAGNETIC RESONANCE IN MEDICINE 321, 325 (1991),  nerve was believed to exhibit a relatively short $T_2$ time. Surprisingly, however, measurements have been conducted indicating that the $T_2$ of muscle is approximately 27 milliseconds, while the $T_2$ of peripheral nerve is approximately 55 milliseconds, providing a factor of two difference between the two types of tissue.

ix. Additional Enhancements for Neural Imaging (a) Vessel Suppression

In addition to the fat suppression and muscle suppression techniques described above, vessel suppression may be employed to improve the neurographic selectivity of the images generated by system 14. Due to the brightness of slowly moving blood in some otherwise useful sequences, vessel suppression has particular value when used in connection with long TE sequence neurograms.

A variety of alternative approaches can be employed to achieve the desired blood vessel suppression. For example, in a first embodiment, the blood vessels are separately imaged to produce a flow-based MR angiogram, employing phase contrast or time-of-flight information. The angiogram may be produced using the MRI system 14, under separate program instructions, or the auxiliary data collection system 22 described below. The angiogram is then subtracted from the neural image to provide a neurogram in which blood vessels content is completely suppressed.

As previously noted in connection with the discussion of image subtraction, a registration problem occurs when the information to be removed from one image is not identically represented with the same intensity and location in the subtrahend image. With vessel image information obtained using an angiography pulse-echo sequence (or other techniques described below) and neural image information obtained using the neural pulse-echo sequence described above, some difference in vessel intensity in the two images is to be expected. One way of avoiding registration error in this situation is to normalize the angiogram to the corresponding neural image (i.e., equalize angiogram intensity based upon comparative measurements at a vessel pixel identified on the angiogram).

A second technique used for vessel suppression is to employ a short TE sequence to produce a first image in which blood vessels are relatively bright and nerves are relatively dim. This image is then subtracted from a second image obtained using a long TE and exhibiting bright nerves and dim vessels.

A third blood vessel suppression technique involves the administration of an intravenous "black blood" contrast agent to the vessels. The agent is preferably (but not necessarily) of the "blood pool" type including dysprosium-DOTA poly lysine or iron oxide type contrast agent. The blood vessels are thereby blacked out by the pharmaceutical agent so there is no need for a subtraction step to produce the desired vessel-suppressed neurogram.

Finally, carefully adjusted water suppression techniques can be used to limit the contribution of the blood vessels and cerebro-spinal fluid (CSF) to the neural image generated by system 14. One such technique is fluid-attenuated, inversion recovery (FLAIR), described in, for example, Bydde et al., *Comparison of FLAIR Pulse Sequences with Heavily $T_2$ Weighted SE Sequences in MR Imaging of the Brain*, 185 RADIOLOGY SUPP. 151 (1992).

(b) Motion Suppression

Some of the image processing techniques described above, including, for example, the use of diffusion weighting, may be adversely influenced by motion of the region being imaged. To limit the introduction of ambiguous or erroneous content into the images produced (i.e., motion artifact), several different hardware and software features may be employed by the neurography system 14.

As shown in FIG. 19, the acquisition of image information can be electively carried out with the region of the patient under examination immobilized by a splint 156. The splint 156 includes a rigid base 158, made of plastic or some other non-ferro-magnetic material. Base 158 is included to provide a fixed frame of reference for the region under examination and is designed to be optionally rigidly secured within the bore of the imager I. As will be described in greater detail below, once the neurography system 10 has imaged the region, the reference frame provided by base 158 allows another system, like surgical system 28, to operate within that reference frame in a known relationship to the imaged nerves. A non-rigid system, described below, employs fiduciary markers applied to the skin surface within the splint.

A rigid frame 160, made of plastic or some other non-ferromagnetic material, is attached to base 158 and provides structural support for the splint 156. One or more fiduciary markers 162, e.g. water-filled beads or linear marker strips, are provided on the frame 160 and/or base 158 to allow the relationship of frame 160 and base 158 relative to the imaged region to be determined from the images generated. In the preferred arrangement, each marker 162 extends the length of splint 156, so that it is visible in each cross sectional image generated. At least one of the markers or strips 162 is aligned at a non-zero angle to the x, y, and z axes of the image plane, ensuring that its particular location in the image provides a positional reference to the splint.

A sleeve 164, made of a thin film plastic and filled with a conformable substance 166, such as water containing gel, silicone, foam, or cobalt-chloride doped water, is formed around the frame 160 and includes straps 168 for use in attaching the splint to the patient. As shown, the frame 160 and sleeve 164 include a number of open regions 170, providing access to select areas of the region under examination by, for example, surgical system 28. Alternatively, the base 158 may be used with two sleeves. A first such sleeve provides complete and continuous skin contact for imaging, while a second sleeve secures the arm but generally allows access by a surgical device.

A pump 172 is included to allow the fluid to be introduced into sleeve 164 from a reservoir 174 under pressure, forcing the sleeve against the patient's skin and immobilizing the region under examination. A release valve 176, allows the fluid within the sleeve 164 to return to the reservoir 174, relieving pressure within sleeve 164.

In addition to reducing motion artifacts, the splint 156 performs several other functions. First, as suggested above, the splint 156 provides a reference frame that can be used by other components of medical system 12 to ensure that actions are taken in proper relationship to an imaged neural network. Second, the splint 156 may be required to keep the region under examination immobilized for the successful administration of therapy or performance of surgery by system 12.

A third function of splint 156 is the reduction of edge effects that might otherwise be experienced using fat suppression. In that regard, the surface of a region under examination (i.e, the patient's skin) presents an abrupt transition in the nature of the material being imaged. The field inhomogeneity caused by this tissue-to-air interface causes the fat signals in the patient's surface adipose tissue to spread out and/or shift in frequency relative to deeper lying fat surrounding the nerve. The desired effect of fat suppression is, however, to suppress the signal from the underlying tissue adjacent the neural tissue to be imaged. By employing thin flexible polyethylene or other plastic for sleeve 164 and paramagnetically doped water for substance 166, these edge effects introduced at the surface of the region under examination are reduced on the order of 1.5 to 5 for nerve tissues.

Additionally, the splint can be specially designed to move a particular body region during an imaging series to introduce serial stepped repositionings of the limb. The movement can be controlled externally by a hydraulic system with fiber optic feedbacks to assess repositioning. In this fashion, it is possible to collect a series of images with the limb in a controlled series of positions. These can be later assembled to provide a kinematic view of stress or impingements upon a nerve during motion as for the ulnar nerve at the elbow.

Motion artifact can also be addressed by the software used to control neurography system 10. In that regard, to ensure adequate echo amplitude for MRI, the net magnetic moment generated by one pulse sequence typically must be allowed to return near its equilibrium value before the next pulse sequence is initiated. This factor, in combination with the sheer number of sequences typically required for imaging, typically causes data collection to occur over a relatively long period of time (e.g., on the order of 1 to 20 minutes or longer). As will be appreciated, the likelihood that significant patient motion will be experienced during the data collection process increases in direct proportion to the time required for data collection.

The software controlling the data collection processed is optimized to reduce at least some of the delays contributing to motion artifact sensitivity. In the arrangement described above, information from a number of different images may be used to selectively produce a final image. For example, the subtraction neurogram is typically generated on a pixel-by-pixel (or voxel-by-voxel) basis using information from two images obtained with orthogonal diffusion gradients. By interleaving the image sequence so that data for a given pixel is collected for each diffusional gradient before collecting data for any other pixel, the susceptibility of the subtraction process to motion artifact is reduced. Similarly, where multiple images are collected at different gradient strengths to compute the diffusion coefficient D for a given pixel or voxel, as part of the gradient selection process, the susceptibility of the computation to motion artifact can be reduced by collecting data for all gradient strengths at one pixel before data for other pixels is collected. Thus, despite the relatively simple data collection process depicted in FIGS. 9 and 10, in the preferred arrangement, data collection is interleaved by collecting data in several planes at each acquisition rather than completely collecting all repetitions for a given plane before proceeding to the next.

Another technique used to provide the desired motion suppression is based upon the anticipation of certain periodic sources of motion that can be monitored by, for example, the auxiliary data collection system 22. For example, depending upon the region of the patient under examination, the patient's heartbeat and respiration may introduce some motion that is not suppressed by the splint 156. With information regarding the periodicity of these sources available from system 22, computer 72 may then adjust the data collection sequence so that the excitation and echo pulses occur at consistent times relative to the motion introduced by the sources.

One technique for reducing respiratory motion artifact in MRI is disclosed in U.S. Pat. No. 4,930,508 (Shimoni et al.). In contrast, the neurography system 10 can be used with a variety of techniques including mass-spectrometer monitoring of carbon dioxide output, fiber-optic observation at chest wall movement, or auditory monitoring by long tube stethoscope with automated sound analysis.

(c) Fascicle Identification and Nerve Enhancement

Another feature of the neurography system 10 is its ability to image individual nerve fascicles. For example, when a phased array coil 62, or other high resolution MRI system is used with a long TE sequence, individual nerve fascicles appear much brighter than the perineural and epineural tissue within the nerve and between the fascicles, and the nerve takes on the appearance of a multifascicled structure.

Figure 20:
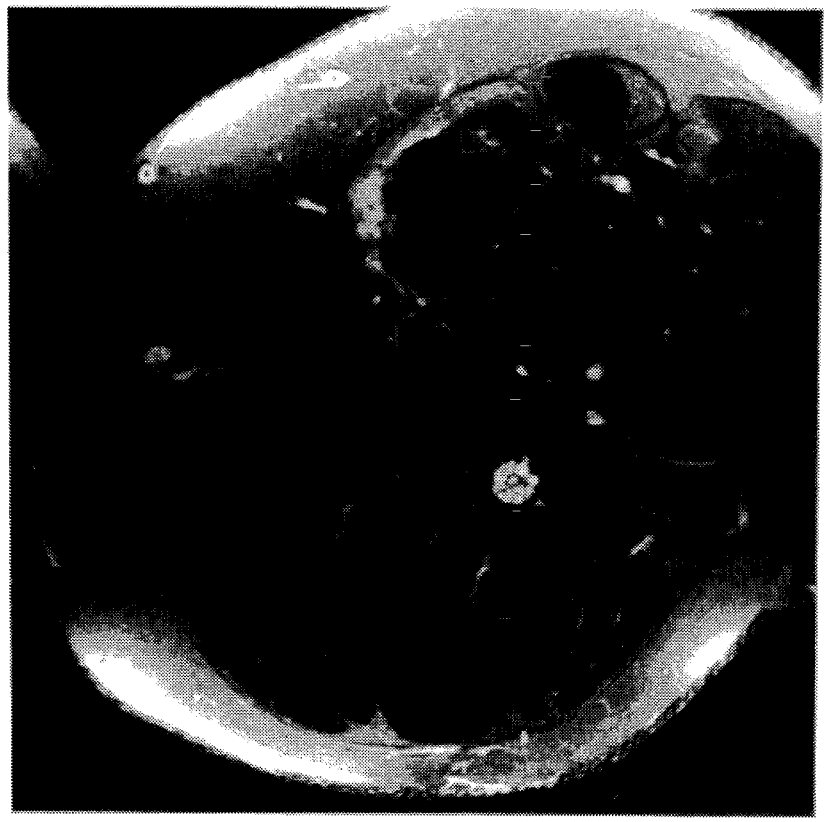
FIGS. 20, 21, and 22 are illustrations of images of a human sciatic nerve produced using the neurography system of FIG. 8, with FIGS. 20 and 21 illustrating the ability of the system to image nerve fascicles (in two cross-sectional scales) and FIG. 22 illustrating an axial projection of the nerve.
Figure 21:
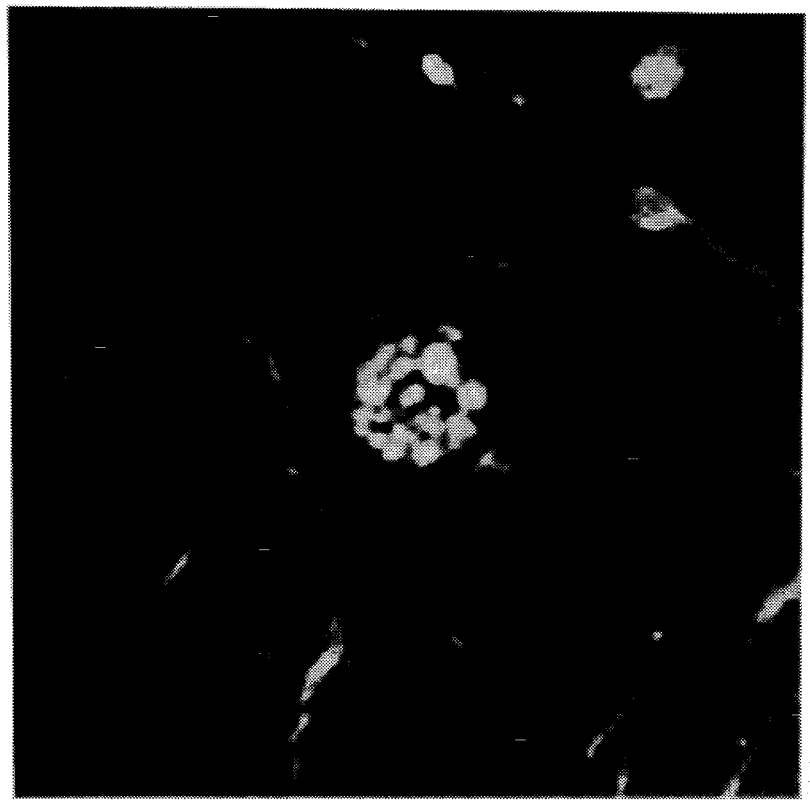
Figure 22:
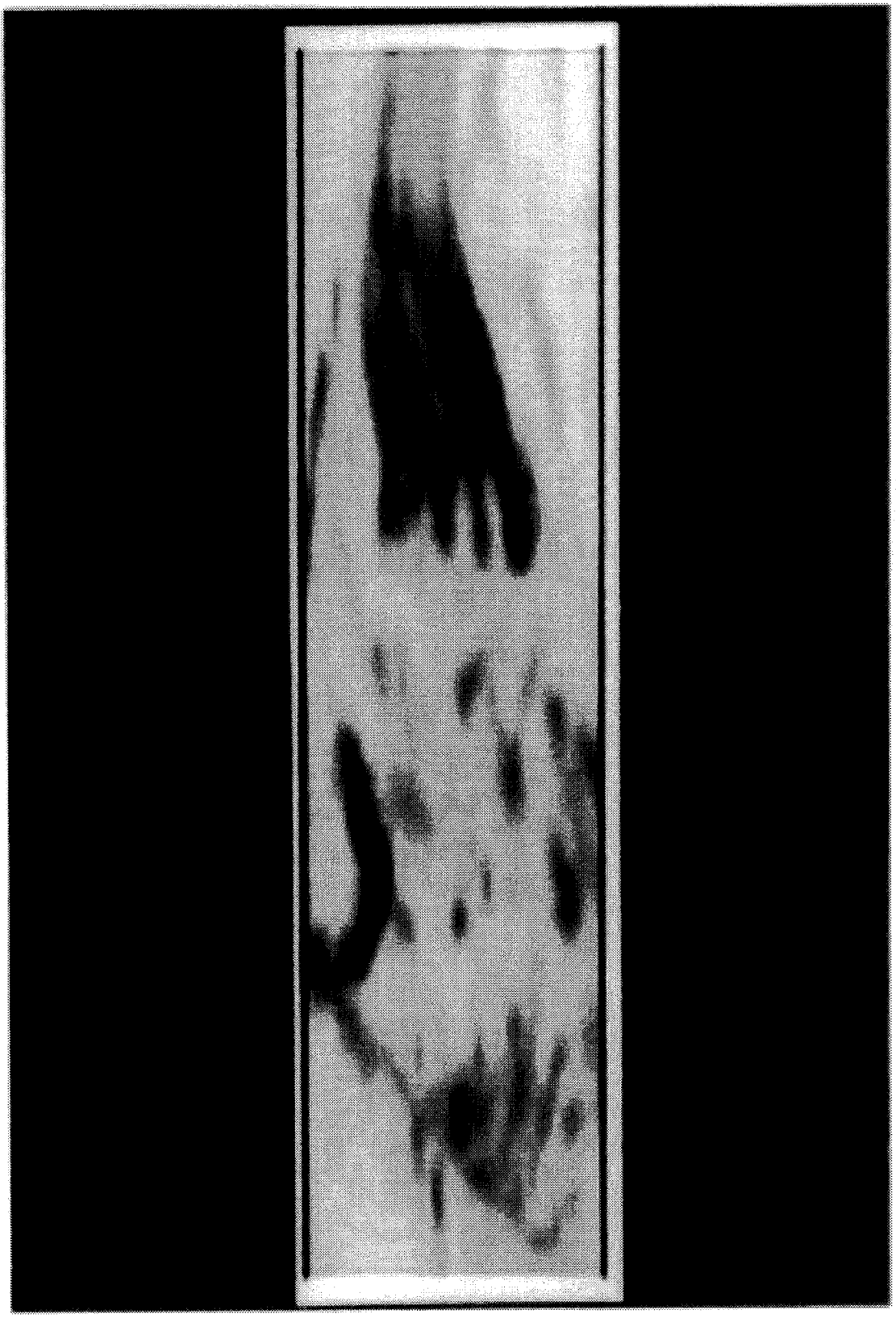

By way of illustration, neural images depicting fascicles in the nerve of a patient having a nerve graft are provided in FIGS. 20, 21, and 22. These images were obtained using a 1.5 Tesla MRI system (Signa System 5.2 software release, sold by GE Medical Systems) with standard 1 Gauss/cm gradients and a phased array RF coil system of the type described above. A "fast" spin-echo sequence with a TR of 5000 ms, TE of 102 ms, and 8 echo train was used with fat suppression and spatial RF pulses for vessel suppression.

Two axial series of images were produced using a two dimensional Fourier transformation. The first series consisted of 24, five mm thick sections, a 512×512 matrix, one mm skip, and one nex (number of excitations). The second series consisted of 41, three mm thick axial sections, a 256×256 matrix, zero mm skip, and two nex. The field of view was 18 cm and acquisition time was 10.6 minutes for both series.

Images from the second series were post-processed by selecting (manually) an elliptical region of interest, approximately two cm in diameter, around the sciatic nerve in each of the sections. This region of interest was selected to exclude blood vessels, without requiring the use of the more analytically complex vessel suppression features described above.

Projectional images were obtained using a maximum intensity projection (MIP) algorithm, available as part of System 5.t (IVI) provided by GE Medical Systems. The resultant neurograms show the interface between the tibial component of the sciatic nerve and the surgically placed sural nerve graft, with FIGS. 20 and 21 illustrating the nerve in progressively larger scale and FIG. 22 illustrating an axial projection of the nerve including graft g. As an additional benefit, this imaging protocol depresses the signal from tissues within the nerve, between and among the fascicles, so that the individual fascicles (f) of the nerve stand out in sharp profile.

The ability of the neurography system 10 to image fascicles is important for several reasons. First, fascicle imaging enhances the diagnostic usefulness of the neurogram because it makes it possible to observe and analyze the internal structure of the nerve for evidence of disease. As will be appreciated, this observation and analysis may be performed visually by the operator or automatically, as part of the operation of the diagnostic system 24 described in greater detail below.

Second, this unique internal organization can be used to provide neural selectivity and enhancement in the imaging process, even when the conspicuity or signal intensity of a particular nerve does not permit identification. More particularly, blood vessels, lymphatics, lymph nodes and collections of adipose tissue, are often similar to nerve in shape, location, and intensity in the cross-sectional images. None of these features, however, exhibit the internal fascicular structure of nerve.

By way of illustration, fascicle identification and nerve confirmation may be used to distinguish nerve from other structures in an ambiguous image in the following manner. First, a thresholding process is used to identify relatively bright regions of the image potentially representative of nerve. With the boundaries of these regions established, the intensity of the pixels associated with each region is evaluated and average image intensities for the regions are computed.

If the intensity of a given pixel within a region is more than some predetermined amount below the average intensity, the structure associated with that pixel is a potential fascicle. A positive fascicle identification is, however, only made if one or more of a plurality of predetermined sequences of such pixel groups representative of fascicular structure are identified. For example, a group of at least 3 such pixels must be found which are adjacent each other and bounded on at least one side by pixels not satisfying this criteria.

The results of this analysis can be used to distinguish bright regions associated with nerve from those associated with, for example, blood vessels or lymphatics. The image intensity of regions not satisfying the fascicular identification parameters may then be adjusted to zero, effectively eliminating these ambiguous structures from the image. Alternatively, a neuroradiologist or other specialist may use this information to select a volume of interest which the neurography system can then render into a projection neurogram.

(d) Miscellaneous Nerve Enhancement Techniques

The various embodiments and features of the neurography system 10 described above can be modified to incorporate alternative approaches to nerve identification and enhancement.

For example, a magnetization transfer pulse sequence can be employed after the fat suppression sequence to enhance neural imaging. Magnetization transfer involves the excitation of chemically shifted protons with an "off resonance" pulse. These protons in a short $T_2$ isotropically diffusing water compartment then exchange into a long $T_2$ anisotropically diffusing compartment. In doing so, they carry the high intensity magnetization signal with them, thus inducing a transfer of magnetization to surrounding neural tissue to increase its conspicuity in the image. Nerve may exhibit efficient exchange between the off-resonance, relatively stationary protons in the myelin sheath and the resonant, mobile protons of axoplasmic water. On the other hand, muscle does not exhibit exchange with a large off-resonant proton pool to a comparable degree. The magnetization transfer pulse sequence is designed to exploit this differential sensitivity between nerve and muscle by using stimulation methods similar to fat suppression to synergistically improve the neurographic selectivity of the image in two ways simultaneously.

Other alternative pulse sequences can also be used. For example, a version of steady state free precession (SSFP), as described in Patz et al., *The Application of Steady-State Free Precession to the Study of Very Slow Fluid Flow*, 3 MAG. RES. MED. 140–145 (1986), can be used. The SSFP is, however, modified to be included in an imaging protocol to achieve fat suppression. Similarly, a magnetization prepared rapid gradient echo (MP-RAGE) sequence, as described in Mugler et al., *Three Dimensional Magnetization Prepared Rapid Gradient-Echo Imaging (3D MP RAGE)*, 15 MAG. RES. MED. 152–157 (1990) can be used if modified to improve $T_2$ contrast. In addition, neural selectivity can be achieved by employing proton fast exchange rates or $T_1$ relaxation rates.

Further alternative techniques for generating neurograms employ sequences optimized to be sensitive to the slow coherent flow of the endoneurial fluid. These sequences provides a unique signal because of the proximal to distal direction of flow and because of the slow flow rate which can be monitored by techniques originally developed to distinguish diffusion from perfusion. Such techniques include, for example, velocity compensation by gradient moment nulling as described in Ehman et al., *Flow Artifact Reduction in MRI: A Review of the Roles of Gradient Moment Nulling and Spatial Pre-saturation,* 14 MAG. RES. MED. 293–307 (1990) and Moran, *A Flow Velocity Zeumatographic Interface for NMR Imaging,* 1 MAG. RES. IM. 197–203 (1982).

3. Medical System Construction and Operation

As noted previously, the neurography system 10 is one component of a broader medical system 12. The remaining components of system 12 are described in greater detail in the following sections. These components provide information to, and process information from, neurography system 10 in accordance with software instructions executed by, for example, a host processing system 32 or the processing systems of individual components of the system 12 to achieve a variety of functions beyond the imaging of peripheral nerve.

a. Auxiliary Data Collection System

The auxiliary data collection system 22 may take any one of a variety of different forms. For example, as suggested above, system 22 may be designed to collect supplemental information regarding structure present within the images produced by system 10. Examples of such systems include a secondary MRI system, employing conventional pulse-echo sequences suitable for use in angiography or STIR sequences to show areas of high muscle signal due to denervations or functional loss of the muscle; an X-ray imaging system suitable for use in generating image data of bone and/or tissue, a PET scanning system for showing the progress of an axionally transported pharmaceutical agent; or a CT system for collecting contrast agent lymphography data. The splint 156 is also formed with fiduciary markers visible using CT and MRI (e.g., iodine contrast material in water), allowing the information from systems 10 and 22 to be integrated.

The supplemental information may be used to suppress structural content in the image and provide greater neural selectivity. For example, an angiogram may be used to remove vessel image content from the neurogram or to distinguish nerve and vessels on the basis of color. Alternatively, because non-neural structure is generally absent in the image anyway, the additional information may be employed to add specific structures, such as blood vessels, back into the neurogram unambiguously. This process allows alternative structure to be readily differentiated using different colors to display information from different sources. As will be appreciated, the addition of structure into a MR image viewed to assess neural structure was virtually unthinkable with prior art systems due to the low signal content of neural return components.

An alternative type of data collection system 22 is employed to collect information about the patient for use in controlling the operation of the neurography system 10, rather than modifying its output. Examples of such systems include conventional heart rate and respiration monitors, used to time the data collection sequencing of system 10 relative to the heart rate and respiration of the patient.

A final type of data collection system 22 of interest is one designed to collect supplemental information about the neural network. For example, system 22 may be constructed to produce an output indicative of nerve conduction velocity (NCV), including the approximate location of a change in NCV or the NCV response to magnetic stimulation. Information from evoked potential electrodes or magnetic SQUID detectors might also be collected and integrated for a multi-input display.

b. Diagnostic System

The diagnostic system 24 is selected to process the image neurograms and other information (such as D and $T_2$) provided by neurography system 10 to provide an attending physician with, for example, diagnoses of neural anomalies. Alternatively, system 24 may assist the physician in making a diagnosis, or assessing the need for, or likely success of, surgery. In one embodiment, system 24 may be employed simply to confirm or question the physician's diagnoses.

Figure 23:
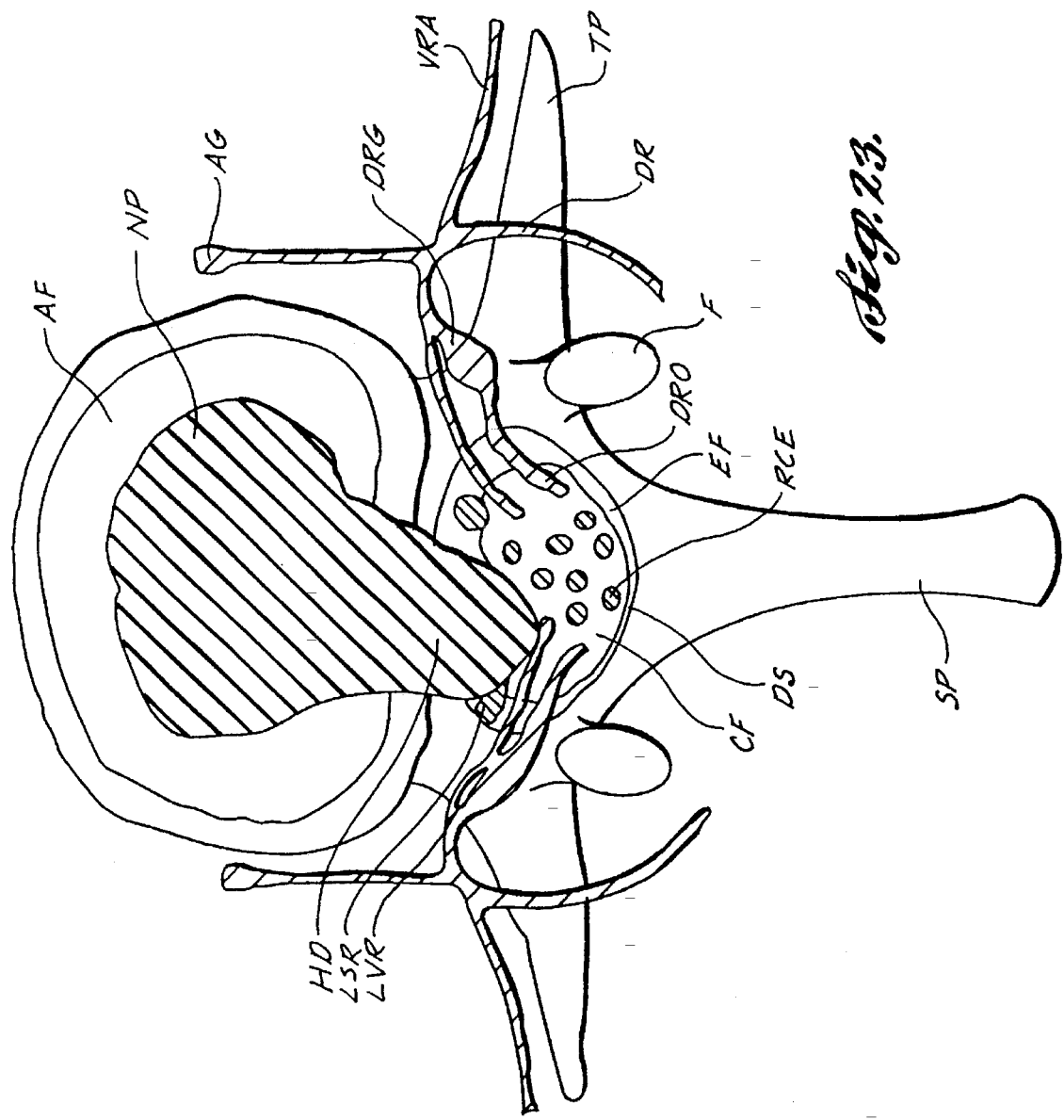
FIG. 23 is a diagram of a cross-section of a vertebra, illustrating the types of structure present in one neurography application.

By way of illustration, one region in which problematic neural disorders commonly occur but are difficult to diagnose is the spinal canal. As shown in the cross sectional view of one vertebra provided in FIG. 23, the region of interest exhibits a relatively high physiological complexity. The illustrated structures include a herniated disc (HD), compressed left spinal root (LSR), spinous process (SP), anulus fibrosus (AF), nucleus pulposus (NP), autonomic ganglion (AG), left ventral root (LVR), ventral ramus (VRA), transverse process (TP), dorsal ramus (DRA), dorsal root ganglion (DRG), facet (F), dorsal root (DRO), extradural fat (EF), root in cauda equina (RCE), dural sac (DS), and cerebrospinal fluid (CF).

In this diagram, the two features of primary interest are the left spinal root (LSR) and the left ventral root (LVR), which are both in risk of compression from the herniating disc (HD). Both nerves are traveling through extradural fat (EF) but are surrounded by bone, which could impair observation by an X-ray based technique. Both nerves are also near the strong water signal of the disc (HD), cerebrospinal fluid (CF) in the dural sac (DS), and other inflamed tissue (which often diminishes image resolution and quality in generally used magnetic resonance techniques).

The left spinal root (LSR) and left ventral root (LVR) of diagnostic interest are small relative to the numerous large anatomic structures nearby. Also, these roots are nearly perpendicular to each other. This common imaging problem can be addressed by the use of a neurography system 10 programmed to employ fat suppression, followed by pulsed diffusion gradients oriented to enhance either the left spinal root (LSR) or left ventral root (LVR), so that each can be clearly seen in a given image. If either root is compressed, its image will demonstrate physical distortion or an imprint due to the compression, which may manifest itself as a change in structure or signal intensity between the two sides of a compression.

As will be appreciated, due to the selectivity and resolution of the neurograms produced by system 10, they can be evaluated by a physician to diagnose any neural abnormalities present. In addition, the image produced by system 10 can be analyzed by diagnostic system 24 to detect, for example, evidence of compression or inflammation and provide the appropriate diagnosis.

The operation of system 24 depends, in part, upon the condition to be evaluated. In one embodiment, the operator initially views a two- or three-dimensional image generated on a cathode-ray tube (CRT) display, included with system 24 and uses a cursor to identify a particular imaged nerve to be evaluated. The operator may also input the particular types of anomalies to be detected.

The system 24 then determines the boundaries of the imaged nerve in each of the two dimensional images available, using a thresholding process. These boundaries can then be compared from one image to the next to look for discontinuities or changes in shape associated with a particular anomaly of interest. For example, if this analysis were used with a nerve severed in an accident, the nerve might disappear entirely from certain images in which it would otherwise be expected to appear. The system 24 is able to readily identify such regions and provide the physician with precise locational information regarding the anomaly.

Similarly, the physician may be interested in conditions associated with less pronounced changes in nerve boundary or intensity. The system 24 is readily able to provide outputs indicative of the average intensity of a bounded neural area, as well as the size and shape of the bounded area on an image-by-image basis. This information can then be used to detect anomalies such as compressions.

In one arrangement, a cursor can be used to initialize a reference boundary of interest on the CRT (e.g., associated with a "normal" neural cross section) for use by system 24. System 24 then compares the actual boundary of the nerve in subsequent images to the reference boundary to locate and quantify the extent of neural compressions. This quantification of an anomaly then allows the physician to monitor the recovery of the nerve and assess the effectiveness of any therapy being provided.

Another approach that may be employed by system 24, is based upon the apparent increase in $T_2$ exhibited by injured nerve. More particularly, an initial "long $T_2$" analysis or diffusion weighted image can be performed to image all neural structures. Then $T_2$ can be extended to roughly 100 milliseconds to image only those nerves that are injured.

An additional approach for use in the manual evaluation of, for example, bone fractures and injuries to joints, involves the analysis of an image in which the fat component is selectively demonstrated and remaining tissues suppressed. This approach emphasizes the appearance of skin, adipose collections, and of bone (in many locations) due to the presence of marrow. When such an image is collected and assigned a color other than that used to display nerve, the two images can be shown transparently in the same three dimensional construction. As a result, the physician is provided with useful information regarding the physical relationship between nerves and bones. This information is most important in the evaluation and treatment of bone fractures and joint injuries.

In some applications, a contrast agent may be used to synergistically highlight the anomaly of interest. Alternatively, because nerves appear bright and isolated in an image, it may be more informative to selectively black out one of the nerves by means of administering an intraneural pharmaceutical contrast agent.

In addition to analyzing the output of neurography system 10, the diagnostic system 24 may also provide feedback to system 10 to control the pulse sequences used and the type of information produced. For example, where sites of nerve compression, section, laceration, or fibrosis are imaged, the alteration in endoneurial fluid flow and in axoplasmic flow are readily detected by monitoring the increase in signal intensity when $T_2$-based, or other, neurographic sequences are used.

Although not described in detail herein, a variety of different diagnostic applications are contemplated including:

1. The demonstration of a patient's peripheral, cranial, and autonomic nerve and nerve plexus anatomy.
2. The demonstration of a patient's spinal root anatomy, particularly the cervical, thoracic and lumbar spinal roots and nerves where they pass through fat at the foramina through which they exit the spinal canal.
3. The demonstration of a patient's spinal root anatomy within the lumbar canal where the roots pass through quantities of extradural fat.
4. The examination of a patient's cranial nerves for compressions by vessels or other structures which could cause trigeminal neuralgia (Vth nerve), hemifacial spasm or Bell's palsy (VIIth nerve), essential hypertension (Xth nerve) or other cranial nerve syndromes.
5. The demonstration of nerve, plexus or root compressions or injuries in a patient, where abnormal changes in the direction, position, or other diffusional properties are caused by an injurious process, such as nerve transection, demyelinating diseases, neuritis, multiple sclerosis, peripheral neuropathies and crush injuries, as well as the monitoring of the regrowth of nerves.
6. The determination of the location of tumors or other masses within the spinal cord where it is useful to know the position of cortico-spinal motor tracts or other functional white matter long tracts relative to some abnormality.
7. Demonstrating the anatomy of the optic nerve, an extension of the brain, where it passes through the peri-orbital fat or other fat on its route to the retina.
8. Tract tracing within the brain to provide useful images for study by radiologists, surgeons or physicians and, in particular, for identification of the location of areas of 'eloquent cortex' such as the motor strip, or speech-related areas. This method involves the spatial identification of relevant areas of the thalamus or internal capsule and then following projecting tracts to the area of interest on the cortical surface, or identifying regions of interest by reference to their connections with other areas on the cortical surface. For example, speech cortex projection tracts can be followed from areas known to be involved in speech production to (and through) other areas where an injury or stroke may have blocked proper nerve function.
9. Tracing of nerves as they pass through tumors of low diffusional anisotropy, such as the passage of the VIIth nerve through an acoustic neuroma to permit a surgeon to know the location of the nerve in or near the tumor and so to have the ability to avoid the nerve during surgery on the tumor.
10. Application of diffusion anisotropy imaging for the evaluation of diffuse axonal injury, as may occur in head injury.
11. The evaluation of bone fractures and joint dislocations or dislocation/fractures in which surgical planning, management and fixation would benefit from knowing the course of the nerve in the region of the abnormal anatomy.

c. Therapeutic System

As noted previously, a therapeutic system 26 is also employed to process information from neurography system 10 or other components of medical system 12 to better effect the administration of therapy to the patient. For example, system 26 may be a drug-delivery system or a current-stimulation system that employs feedback from neurography system 10 to regulate its operation. In this fashion, more precise nerve conduction velocity (NCV) or evoked potential tests can be done using neurographic data to place stimulating or recording electrodes. For therapy, tract information could aid in the placement of transplant tissue or for lesions of areas of abnormal activity that might cause tremor in the thalamus.

d. Surgical System

The surgical system 28 employs neurographic information from system 10 to influence any one of a variety of surgical operations that may be performed. The information obtained may be used to avoid neural paths during surgery or to confirm the location and nature of neural surgery required. The operation of surgical system 28 may be automatically controlled in response to feedback from system 10 or may manually controlled by a surgeon based upon his or her review of the information provided.

In one embodiment, the region of the patient that is to undergo surgery is placed in the splint 156 described above. The open regions 170 of splint 156 need to be designed and positioned to ensure that splint 156 will not interfere with the surgical system 28 during the performance of an operation. With the splint 156 applied, image data is then collected via the neurography system 10. As noted previously, the processing system 16 of neurography system 10 provides numerical coordinates, in three dimensions, describing the position of the nerves along their courses with reference to the splint base 158 and fiduciary markers 162.

Depending upon the nature of the operation to be performed, outputs from the auxiliary data collection system 22 may also be required. For example, if system 28 is employed to operate on bone within the region imaged, system 22 may be called upon to generate a fat selective image of the bone, or the patient may be brought to a C-T scanner for preparation of a bone image. The MRI splint 156 will be worn while this additional information is collected, but additional markers (e.g., chalk or iodine solution for CT X-rays) are required to extract locational information from the secondary image and, hence, provide the requisite registration between the two images generated.

Figure 24:
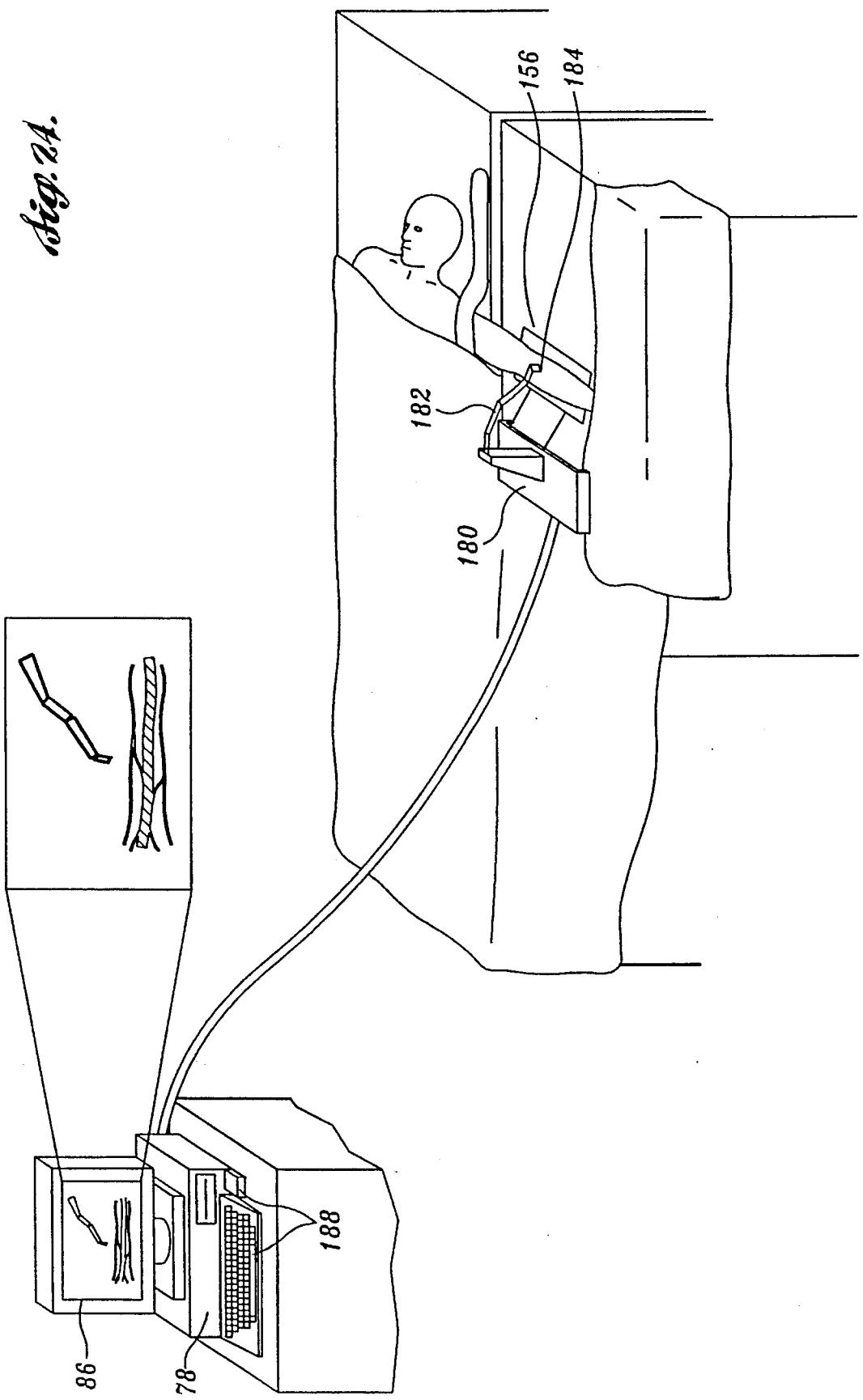
FIG. 24 is a schematic illustration of a surgical system constructed in accordance with this invention for use with the neurography system of FIG. 8.

The image information is loaded into the memory of a surgical system processor 178, shown in FIG. 24. As will be described in greater detail below, in the preferred arrangement, processor 178 is programmed to guide surgical operations performed in a coordinate system that is referenced to the image coordinate system. The base 158 of splint 156 is secured to a platform 180 included in surgical system 28 to provide a fixed relationship between the coordinate systems used in the image and by system 28. The coordinate systems are then linked by processor 178 using a computer model of three-dimensional space. Confirmatory X-rays may be taken conveniently during the procedure to assure correct positioning of the markers.

An articulated surgical arm 182 is coupled to the platform 180 and has a stylus 184 (e.g., a surgical apparatus, such as a focused laser beam or a drill) provided at its free end. The arm 182 can be moved electrically or pneumatically to any select point, or along any select path, defined relative to the operating environment in response to outputs from processor 178. The position of the arm 182 can, thus, be tracked via the control outputs applied by the processor 178. As will be appreciated, a separate coordinate-based or laser-based positioning system may be employed if desired.

In the preferred embodiment, the position of the stylus relative to the imaged neural and other networks is illustrated on a system display 186 during the course of a surgical operation. The surgeon may manually guide the stylus 184 during the operation via, for example, a joystick, electronic glove, or other input device 188, visually monitoring the position of the stylus relative to anatomical structure. This visual feedback may be based simply upon a comparison of the known positional relationship of the stylus to the previously collected image.

Alternatively, it is possible to obtain visual confirmation using imaging feedback data collected in real time. For instance, with the use of high-speed MRI data collection sequences, such as echo planar imaging described in Worthington et al., *The Clinical Applications of Echo Planar Imaging in Neuroradiology*, 32 NEURORADIOLOGY 367–370 (1990), it is possible to rapidly update images. When the resulting images are displayed, the surgeon may observe the progression of an appropriately labeled, non-magnetic probe into the body in real time. If a slower image collection process is employed, the probe or device is advanced in steps as a series of images are taken. In either case, the neurographic image provides the surgeon with apparent vision of sensitive neural tissue inside opaque, solid body structures, in much the same manner as fluoroscopy, but while also providing information regarding neural paths.

As an alternative to requiring the surgeon to control the operation of system 28 during surgery, a computer-guided, stereotaxic, or fiduciary system may be employed. In that regard, the surgeon may provide processor 178 with input identifying the nature of the operation to be performed, including the stylus path and operation appropriate for the surgery to be performed. These steps can be performed with the arm 182 disengaged, allowing the surgeon to simulate the operation and view the stylus path on the image, before the surgical procedure is confirmed. Once confirmed, the processor 178 can then be instructed to automatically guide the arm 182 over the desired path during the actual surgical operation.

The use of surgical system 28 has a number of important advantages over the "neurally blind" surgical methods currently employed. For example, because nerves are readily imaged, the surgeon is better able to assess any neural conditions that might require treatment or alter the surgical plan. In addition, because the position of the stylus 182 relative to nerve is readily imaged and can be confirmed before an operation is performed, accidental intrusion of the stylus upon neural paths is avoided.

Although a splint 156 is employed in the embodiment described above to provide a link between the referential frames of the neurogram and surgical system 28, it is not mandatory. For example, particularly in regions that are relatively unsusceptible to motion artifact, fiduciary markers can be applied directly to the body (e.g., on the head or face when nerves of facial sensation or movement are involved, or adjacent the iliac crests and lumbar vertebral spinous processes when lumbar nerve roots are involved).

The use of a computer-guided surgical system 28 employing such fiduciary markers is believed to be of particular importance in cervical, thoracic or lumbar spine surgery. In that regard, system 28 will eliminate the problem of doing a "good" operation but at the wrong level, e.g., inadvertently decompressing the lumbar 3/4 root when the symptomatic compression to be relieved was actually at the lumbar 4/5 root. For spine work, the original image can be collected with a strip of fiduciary markers taped to the patient's back and independently marked in a manner that can be sensed by system 28 to allow location of the stylus 182 during surgery.

As will be appreciated, the various components of the surgical system 28 can be altered in a variety of manners. For example, the stylus 182 may include a surface detector of electrical fields or a magnetic detector of nerve activity, constructed to detect the activity of nerves. Examples of such devices include a somatosensory evoked potential or magneto-encephalography system. As a result, the detection of nerves offered by embodiment of the stylus 182 allows the position of the stylus relative to nerve determined by reference to the neurogram to be confirmed.

One application for surgical system 28 that is of particular importance is in surgery of the neck. Surgery of this type includes, for example, a carotid endarterectomy to remove stroke producing plaque from the internal carotid artery, an anterior cervical discectomy to relieve a cervical root compression, or an operation for cancer in the neck. One of the most common complications of such surgery is the accidental crushing or transection of the recurrent laryngeal nerve, possibly resulting in permanent paralysis of one or both sets of vocal cords. Optimally, a preoperative neurographic image is used to demonstrate the course of the recurrent laryngeal nerve, allowing the surgeon to more effectively avoid it or at least identify and protect it during surgery.

Neurographic guidance can be also used for percutaneous needle biopsy of lesions, or for the placement of more elaborate percutaneous systems such as ultrasonic or other mechanical devices used to remove tissues. By way of illustration, such operations include discectomies, the introduction of laser/suction systems, the placement of RF lesioning devices used in procedures such as gangliolysis of the fifth cranial nerve, the placement of probes to carry out deep tissue localized drug administration, diathermy, cryotherapy, or other physical or mechanical techniques. Neurographic guidance may also be used to control the passage of rigid endoscopes through solid tissues or to guide the placement of directable flexible endoscopes.

Yet another important application of surgical system 28 is in the use of CNS neurograms to guide stereotactic surgery in the brain. Currently, tissue structures visible by virtue of their $T_1$ or $T_2$ MRI are used to guide stereotactic surgery. In contrast, CNS neurograms provide information concerning the connections or relation of specific tracts of interest, which may travel in or among other tracts from which they cannot be differentiated by means of conventional tissue-based images.

e. Training and Development System

The training and development system 30 may take any one of a variety of forms designed to process information collected from the neurography system 10. In one embodiment, neurographic images are collected from a plurality of patients to produce an anatomical atlas of normal and abnormal neural paths for reference by surgeons and others. Images obtained from a patient can be compared to the clinically known population in the atlas to rapidly identify anomalous nerve courses in a patient set to undergo surgery for some condition. As a result, the surgeon may be able to modify his or her technique to reduce the risk of injury to nerves which happen to be in the field of surgery. Similarly, a neurographic map of an individual patient's skin and cutaneous nerves can be used to help the surgeon plan incisions that avoid the very common complication of accidental transection of cutaneous nerves in the course of routine surgical incision to reach structures below the skin.

In another embodiment, the training and development system 30 may be designed to assess the effectiveness of the programming employed by neurography system 10 and may provide feedback to system 10 to regulate its operation and enhance the quality of the neurograms generated. More particularly, once a sequence able to positively identify nerve has been employed, alternative sequences can be employed and their results compared to the confirmed method. As a result, a collection of techniques can be established and programmed into neurography system, along with the conditions under which each sequence offers the best performance.

Another alternative training and development system 30 may be employed to assess the effectiveness of intraneural, pharmaceutical contrast agents designed to help in the diagnosis of nerve compressions. More particularly, such a training system 30 is used to quantify the image contrast produced using different contrast agents to image known neural anomalies. As a result, system 30 is able to identify those agents providing the best results for particular neural imaging problems.

Yet another embodiment of training and development system 30 allows information from neurograms to be used in the design of any of a variety of products. For example, the neurograms produced by system 10 provide information that is of great advantage to designers of ergonomic furniture, high gravity air or space craft seats, specialized body suits, boots, and various kinds of electronic or electric medical equipment, which can be best used when the positions of nerves can be precisely located in advance. The system 30 incorporates information regarding neural paths from system 10 into the computational processes involved in designing such equipment to provide enhanced product performance.

As one illustration, in the ergonomic design of a chair, system 30 would be programmed to ensure that the primary support provided by the chair does not coincide with a neural path in the relevant customer population. This can be done by superimposing the neural network of a sitting person upon a mathematical model of the chair, identifying the primary points of support, and generating flags on the display for any support points that are within some predetermined distance of a nerve. As a result, the chair design can be manipulated to avoid neural compressions.

In another application, the system 30 can be used to control electronic prosthesis. More particularly, the information from system 10 can be used to locate electronic detectors adjacent, for example, a severed nerve to detect neural activity associated with the limb replaced by the prosthesis. The detected activity of the nerve is then used to control the prosthesis.

4. Non-neural Imaging Applications

In principle, selective imaging of any other object or subject may be effected using the MRI techniques described above, if that subject or object exhibits characteristics corresponding to the neural characteristics described above. For example, objects exhibiting diffusion anisotropy in any part thereof can be imaged using diffusional weighting. Thus, in medicine, for example, the cardiovascular system could also be imaged in this fashion and the technique can also be employed to examine, for example, rock strata and plants, if they exhibit diffusion anisotropy.

5. Conclusion

The lack of a suitable method for creating a distinct image of the nerves has been a great hindrance to physicians, surgeons, athletic trainers, and pain treatment specialists. Although, previously, it has sometimes been possible to make a nerve stand out from immediately surrounding structures, the unique ability of system 10 to make the nerve stand out from all other structures represents a significant advance. The sensitivity of the system 10 allows even the smallest nerves to be accurately identified and linked to form three-dimensional projections of a neural network. The neurographic information can be collected rapidly, without requiring contrast agents.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of utilizing magnetic resonance to determine the shape and position of mammal tissue, said method including the steps of:
   (a) exposing an in vivo region of a subject to a magnetic polarizing field, the in vivo region including non-neural tissue and a nerve, the nerve being a member of the group consisting of peripheral nerves, cranial nerves numbers three through twelve, and autonomic nerves;
   (b) exposing the in vivo region to an electromagnetic excitation field;
   (c) sensing a resonant response of the in vivo region to the polarizing and excitation fields and producing an output indicative of the resonant response;
   (d) controlling the performance of the steps (a), (b), and (c) to enhance, in the output produced, the selectivity of said nerve, while the nerve is living in the in vivo region of the subject; and
   (e) processing the output to generate a data set describing the shape and position of said nerve, said data set distinguishing said nerve from non-neural tissue, in the in vivo region to provide a conspicuity of the nerve that is at least 1.1 times that of the non-neural tissue, without the use of neural contrast agents, said processing including the step of analyzing said output for information representative of fascicles found in peripheral nerves, cranial nerves numbers three through twelve, and autonomic nerves.

2. The method of claim 1, wherein the step of processing further includes using the results of said step of analyzing the output for information representative of fascicles to suppress from said data set tissue that is not fascicular.

3. A method of utilizing magnetic resonance to determine the shape and position of mammal tissue, said method including the steps of:
   (a) exposing an in vivo region of a subject to a magnetic polarizing field, the in vivo region including non-neural tissue and a nerve, the nerve being a member of the group consisting of peripheral nerves, cranial nerves numbers three through twelve, and autonomic nerves;
   (b) exposing the in vivo region to an electromagnetic excitation field;
   (c) sensing a resonant response of the in vivo region to the polarizing and excitation fields and producing an output indicative of the resonant response;
   (d) controlling the performance of the steps (a), (b), and (c) to enhance, in the output produced, the selectivity of said nerve, while the nerve is living in the in vivo region of the subject, said step of controlling the performance of steps (a), (b), and (c) including selecting a combination of echo time and repetition time that exploits a characteristic spin-spin relaxation coefficient of peripheral nerves, cranial nerves numbers three through twelve, and autonomic nerves, wherein said spin-spin relaxation coefficient is substantially longer than that of other surrounding tissue; and
   (e) processing the output to generate a data set describing the shape and position of said nerve, said data set distinguishing said nerve from non-neural tissue, in the in vivo region to provide a conspicuity of the nerve that is at least 1.1 times that of the non-neural tissue, without the use of neural contrast agents.

4. The method of claim 3, wherein the step of selecting said combination of echo time and repetition time includes selection of an echo time that is greater than 60 milliseconds to enhance the distinction of said nerve from non-neural tissue in the in vivo region.

5. The method of claim 4, further comprising the step of repeating said step of exposing the in vivo region to an excitation field after a repetition time that is greater than one second to enhance the distinction of said nerve from the non-neural tissue in the in vivo region.

6. The method of claim 4, wherein the non-neural tissue includes fat and said method further comprises exposing the in vivo region to electromagnetic fields that suppress the contribution of the fat in said output prior to producing an output at step (c).

7. A method of utilizing magnetic resonance to determine the shape and position of mammal tissue, said method including the steps of:
   (a) exposing an in vivo region of a subject to a magnetic polarizing field, the in vivo region including non-neural tissue and a nerve, the nerve being a member of the group consisting of peripheral nerves, cranial nerves numbers three through twelve, and autonomic nerves, said magnetic polarizing field including a first diffusion-weighted gradient that is substantially parallel to the nerve and a second diffusion-weighted gradient that is substantially perpendicular to the nerve;
   (b) exposing the in vivo region to an electromagnetic excitation field;
   (c) sensing a resonant response of the in vivo region to the polarizing and excitation fields and producing a first output indicative of the resonant response to said first diffusion-weighted gradient and a second output indicative of the response to said second diffusion-weighted gradient;
   (d) controlling the performance of the steps (a), (b), and (c) to enhance, in the output produced, the selectivity of said nerve, while the nerve is living in the in vivo region of the subject; and
   (e) subtracting said first output from said second output to generate a data set describing the shape and position of said nerve, said data set distinguishing said nerve from non-neural tissue, in the in vivo region to provide a conspicuity of the nerve that is at least 1.1 times that of the non-neural tissue, without the use of neural contrast agents.

8. The method of claim 7, wherein the step of subtracting further includes the step of determining a registration between the first output and the second output.

9. The method of claim 8, wherein said method includes the step of inhibiting the step of subtracting unless a threshold level of registration is exhibited between the first and second outputs.

10. The method of claim 7, wherein the non-neural tissue includes fat, and wherein the method includes the step of exposing the in vivo region to electromagnetic fields that suppress the contribution of the fat in said first and second outputs prior to the steps exposing the in vivo region to said first and second gradients.

11. A method of utilizing magnetic resonance to determine the shape and position of mammal tissue, said method including the steps of:
   (a) exposing an in vivo region of a subject to a magnetic polarizing field that includes a predetermined arrangement of diffusion-weighted gradients, the in vivo region including non-neural tissue and a nerve, the nerve being a member of the group consisting of peripheral nerves, cranial nerves numbers three through twelve, and autonomic nerves;
   (b) exposing the in vivo region to an electromagnetic excitation field;

(c) sensing a resonant response of the in vivo region to the polarizing and excitation fields and producing an output indicative of the resonant response, said producing an output indicative of the resonant response including the step of producing a separate output for each diffusion-weighted gradient of said predetermined arrangement of diffusion-weighted gradients;

(d) controlling the performance of the steps (a), (b), and (c) to enhance, in the output produced, the selectivity of said nerve, while the nerve is living in the in vivo region of the subject;

(e) processing the output to generate a data set describing the shape and position of said nerve, said data set distinguishing said nerve from non-neural tissue, in the in vivo region to provide a conspicuity of the nerve that is at least 1.1 times that of the non-neural tissue, without the use of neural contrast agents, said processing the output including the step of vector processing the separate outputs for each said diffusion-weighted gradient of said predetermined arrangement of diffusion-weighted gradients to generate data representative of anisotropic diffusion exhibited by the nerve, and processing said data representative of said anisotropic diffusion to generate said data set describing the shape and position of the nerve.

12. A method of utilizing magnetic resonance to determine the shape and position of mammal tissue, said method including the steps of:

(a) exposing an in vivo region of a subject to a magnetic polarizing field, the in vivo region including non-neural tissue that includes fat and a nerve, the nerve being a member of the group consisting of peripheral nerves, cranial nerves numbers three through twelve, and autonomic nerves;

(b) exposing the in vivo region to an electromagnetic excitation field;

(c) sensing a resonant response of the in vivo region to the polarizing and excitation fields and producing an output indicative of the resonant response;

(d) controlling the performance of the steps (a), (b), and (c) to enhance, in the output produced, the selectivity of said nerve, while the nerve is living in the in vivo region of the subject; and (e) processing the output to generate a data set describing the shape and position of said nerve, said data set distinguishing said nerve from non-neural tissue, in the in vivo region to provide a conspicuity of the nerve that is at least 1.1 times that of the non-neural tissue, without the use of neural contrast agents; and said steps of exposing the in vivo region to an excitation field and producing an output being designed to suppress the contribution of fat in the output, said step of processing the output to generate the data set including the step of analyzing the output for information representative of fascicles found in peripheral nerves, cranial nerves numbers three through twelve and autonomic nerves.

13. The system of claim 12, wherein the contribution of fat is suppressed by employing a chemical shift selective sequence.

14. The method of claim 12, wherein the step of processing further includes using the results of said step of analyzing the output for information representative of fascicles to suppress from said data set tissue that is not fascicular.

15. A method of utilizing magnetic resonance to determine the shape and position of mammal tissue, said method including the steps of:

(a) exposing an in vivo region of a subject to a magnetic polarizing field, the in vivo region including non-neural tissue that includes blood vessels and a nerve, the nerve being a member of the group consisting of peripheral nerves, cranial nerves numbers three through twelve, and autonomic nerves;

(b) exposing the in vivo region to an electromagnetic excitation field;

(c) sensing a resonant response of the in vivo region to the polarizing and excitation fields and producing an output indicative of the resonant response;

(d) performing the steps (a), (b), and (c) to produce a second output in which the conspicuity of blood vessels is enhanced; and (e) processing said output indicative of the resonant response and said second output to generate a data set in which conspicuity of the blood vessels is suppressed, said data set describing the shape and position of said nerve and distinguishing said nerve from non-neural tissue, in the in vivo region to provide a conspicuity of the nerve that is at least 1.1 times that of the non-neural tissue, without the use of neural contrast agents.

16. A method of utilizing magnetic resonance to determine the shape and position of mammal tissue, said method including the steps of:

(a) exposing an in vivo region of a subject to a magnetic polarizing field, the in vivo region including non-neural tissue and a nerve, the nerve being a member of the group consisting of peripheral nerves, cranial nerves numbers three through twelve, and autonomic nerves;

(b) exposing the in vivo region to an electromagnetic excitation field;

(c) sensing a resonant response of the in vivo region to the polarizing and excitation fields and producing an output indicative of the resonant response;

(d) controlling the performance of the steps (a), (b), and (c) to enhance, in the output produced, the selectivity of said nerve, while the nerve is living in the in vivo region of the subject; and (e) processing the output to generate a data set describing the shape and position of said nerve, said data set distinguishing said nerve from non-neural tissue, in the in vivo region to provide a conspicuity of the nerve that is at least 1.1 times that of the non-neural tissue, without the use of neural contrast agents;

wherein said steps (a) through (c) include the step of exposing the in vivo region to a readout gradient rephasing pulse and a slice-selective excitation pulse, said readout gradient rephasing pulse being generated directly before said output pulse is produced instead of directly after the generation of the slice-selective excitation pulse, so as to reduce the appearance of undesirable cross-terms in said data set.

17. The method of claim 16, wherein said steps (a) through (c) further include the step of exposing the in vivo region to a two-part phase encoding gradient, so as to further reduce the appearance of undesirable cross-terms in said data set.

18. A method of utilizing magnetic resonance to determine the shape and position of mammal tissue, said method including the steps of:

(a) exposing an in vivo region of a subject to a magnetic polarizing field, the in vivo region including non-neural tissue and a nerve, the nerve including epineurium and perineurium and being a member of the group consisting of peripheral nerves, cranial nerves numbers three through twelve, and autonomic nerves;

(b) exposing the in vivo region to an electromagnetic excitation field;

(c) sensing a resonant response of the in vivo region to the polarizing and excitation fields and producing an output indicative of the resonant response;

(d) controlling the performance of the steps (a), (b), and (c) to enhance, in the output produced, the selectivity of said nerve, while the nerve is living in the in vivo region of the subject; and (e) processing the output to generate a data set describing the shape and position of said nerve, said data set distinguishing said nerve from non-neural tissue, in the in vivo region to provide a conspicuity of the nerve that is at least 1.1 times that of any adjacent non-neural tissue, without the use of neural contrast agents.

19. The method of claim 18, wherein said data set distinguishes said nerve from non-neural tissue in the in vivo region so that said data set describes the nerve at an intensity at least 5 times that of the non-neural tissue.

20. The method of claim 18, wherein the step of exposing the in vivo region to a polarizing field includes the step of exposing the in vivo region to a polarizing field including at least one diffusion-weighted gradient.

21. The method of claim 20, wherein the at least one diffusion-weighted gradient includes a first gradient substantially parallel to the nerve and a second gradient substantially perpendicular to the nerve, and the step of producing an output includes the steps of producing a first output when the first gradient is employed and a second output when the second gradient is employed, and the step of processing the output includes the step of subtracting the first output from the second output.

22. The method of claim 20, wherein the at least one diffusion-weighted gradient includes a predetermined arrangement of gradients, the step of producing an output includes the step of producing a separate output associated with each gradient, and the step of processing the output includes the steps of vector processing the separate outputs to generate data representative of anisotropic diffusion exhibited by the nerve, and processing said data representative of anisotropic diffusion to generate said data set describing the shape and position of the nerve.

23. The method of claim 18, wherein the non-neural tissue includes fat, and the steps of exposing the in vivo region to an excitation field and producing an output involve the excitation of any fat in the in vivo region in a manner designed to suppress the contribution of the fat to the output.

24. The method of claim 23, wherein the step of processing further includes the step of analyzing the output for information representative of fascicles found in peripheral nerves, cranial nerves numbers three through twelve, and autonomic nerves.

25. The method of claim 18, wherein step (d) includes the step of selecting a combination of echo time and repetition time that exploits a characteristic spin-spin relaxation coefficient of peripheral nerves, cranial nerves numbers three through twelve, and autonomic nerves, said spin-spin relaxation coefficient of these nerves being substantially longer than that of other surrounding tissue.

26. The method of claim 18, wherein step (d) includes the step of controlling said step (b) to expose the in vivo region to an excitation field that induces a magnetization transfer from non-anisotropically diffusing water in the in vivo region to anisotropically diffusing water in said nerve, to more readily distinguish the nerve from non-neural tissue.

27. The method of claim 26, wherein the non-neural tissue includes fat and said method further comprises exposing the in vivo region to electromagnetic fields that suppress the contribution of the fat in said output prior to producing an output at step (c).

28. The method of claim 18, wherein the in vivo region includes blood vessels and said step (d) suppresses the blood vessels from said data set.

29. The method of claim 28, wherein the conspicuity of nerve is enhanced in said output and said steps (a), (b), and (c) are performed a second time to produce a second output in which the conspicuity of blood vessels is enhanced and wherein said step (e) of processing the output includes the step of processing said output and said second output to suppress the blood vessels from said data set.

30. The method of claim 18, wherein if the non-neural tissue in said in vivo region includes blood vessels and cerebrospinal fluid, said step (d) includes the step of selecting the polarizing field of step (a) and the excitation field of step (b) to suppress the blood vessels and the cerebrospinal fluid from said data set.

31. The method of claim 18, wherein said step (c) includes the step of processing said output on an interleaved pixel-by-pixel basis to suppress the influence of motion of the in vivo region on said data set.

32. The method of claim 18, wherein said method further includes the step of immobilizing the in vivo region in a splint to reduce motion artifact in said data set.

33. The method of claim 18, wherein the in vivo region includes a plurality of peripheral nerves, cranial nerves numbers three through twelve, or autonomic nerves, and said method further includes the step of administering a contrast agent to a selected one of the plurality of peripheral nerves, cranial nerves numbers three through twelve, or autonomic nerves to remove said selected one nerve from said data set.

34. The method of claim 18, wherein the intensity of said nerve in said data set is at least 10 times that of non-neural tissue in the in vivo region.

35. The method of claim 18, wherein said method further includes the step of processing said data set to generate an image displaying the shape and position of said nerve.

36. A method of utilizing magnetic resonance to determine the shape and position of a structure, said method including the steps of:

(a) exposing a region to a magnetic polarizing field including a predetermined arrangement of diffusion-weighted gradients, the region including a selected structure that exhibits diffusion anisotropy and other structures that do not exhibit diffusion anisotropy;

(b) exposing the region to an electromagnetic excitation field;

(c) for each of said diffusion-weighted gradients, sensing a resonant response of the region to the excitation field and the polarizing field including the diffusion-weighted gradient and producing an output indicative of the resonant response; and (d) vector processing said outputs to generate data representative of anisotropic diffusion exhibited by said selected structure in the region, regardless of the alignment of said diffusion-weighted gradients with respect to the orientation of said selected structure; and (e) processing said data representative of anisotropic diffusion to generate a data set describing the shape and position of said selected structure in the region, said data set distinguishing said selected structure from other structures in the region that do not exhibit diffusion anisotropy.

37. The method of claim 36, wherein said selected structure is neural tissue in a mammal and said other structures are non-neural tissue in the mammal.

38. The method of claim 37, wherein said step of processing said data representative of anisotropic diffusion includes the steps of:

analyzing said data representative of anisotropic diffusion to determine an effective direction of the anisotropic diffusion exhibited by said neural tissue, so as to determine an optimal orientation for diffusion-weighted gradients;

exposing the region to two additional diffusion-weighted gradients respectively substantially parallel to and substantially perpendicular to said effective direction;

producing two additional outputs indicative of the region's resonant responses respectively to said two additional diffusion-weighted gradients; and calculating a difference between said two additional outputs to generate said data set describing the shape and position of said neural tissue.

39. The method of claim 37, wherein said data set describing the shape and position of said neural tissue describes the shape and position of a selected cross section of said neural tissue, and the steps used to generate said data set are repeated to generate additional data sets describing different cross sections of said neural tissue, and a further data set that describes the three dimensional shape and position of a segment of said neural tissue is generated by steps including:

analyzing the data representative of anisotropic diffusion to determine how to relate said data set and said additional data sets describing the shape and position of cross sections of said neural tissue; and based upon the results of said step of analyzing the data representative of anisotropic diffusion, combining said data set and said additional data sets to generate said further data set that describes the three dimensional shape and position of the segment of said neural tissue, thereby enabling the three dimensional shape and position of curved neural tissue to be described.

40. The method of claim 39, wherein said step of analyzing the data representative of anisotropic diffusion includes determining an effective direction of the anisotropic diffusion exhibited by said neural tissue in each of said selected and different cross sections.

41. The method of claim 37, wherein said predetermined arrangement of gradients includes first, second, and third orthogonal gradients, and said data representative of anisotropic diffusion include a description of an effective vector representative of the anisotropic diffusion exhibited by said neural tissue.

42. The method of claim 41, wherein said data set describing the shape and position of said neural tissue is based upon the length of said effective vector.

43. The method of claim 42, wherein the step of exposing the region to a magnetic polarizing field includes the step of exposing the region to a zero diffusion gradient polarizing field that does not include a diffusion-weighted gradient, the step of producing an output includes the step of producing a zero diffusion gradient output indicative of the region's resonant response to said zero diffusion gradient polarizing field, and the length of said effective vector is normalized by a magnitude of said zero diffusion gradient output.

44. The method of claim 41, wherein said data set describing the shape and position of said neural tissue is based upon an angle describing in part the direction of said effective vector.

45. The method of claim 41, wherein said step of processing said data representative of anisotropic diffusion includes the steps of:

exposing the region to two additional diffusion-weighted gradients respectively substantially parallel to and substantially perpendicular to the direction of said effective vector representative of the anisotropic diffusion exhibited by said neural tissue;

producing two additional outputs indicative of the region's resonant responses respectively to said two additional diffusion-weighted gradients; and calculating a difference between said two additional outputs to generate said data set describing the shape and position of said neural tissue.

46. The method of claim 41, wherein said data set describes the shape and position of a selected cross section of said neural tissue, and the steps used to generate said data set are repeated to generate additional data sets describing different cross sections of said neural tissue, and a further data set that describes the three dimensional shape and position of a segment of said neural tissue is generated by steps including:

analyzing the data representative of anisotropic diffusion to determine how to relate said data set and said additional data sets describing the shape and position of cross sections of said neural tissue; and based upon the results of said step of analyzing the data representative of anisotropic diffusion, combining said data set and said additional data sets to generate said further data set that describes the three dimensional shape and position of the segment of said neural tissue, thereby allowing the three dimensional shape and position of curved neural tissue to be described.

47. The method of claim 46, wherein said step of analyzing the data representative of anisotropic diffusion includes the step of analyzing the direction of the effective vector representative of the anisotropic diffusion exhibited by said neural tissue in each of said cross sections.

48. The method of claim 46, wherein said step of processing said data representative of anisotropic diffusion includes the steps of:

analyzing said data representative of anisotropic diffusion to determine an effective direction of the anisotropic diffusion exhibited by said selected structure, so as to determine an optimal orientation for diffusion-weighted gradients;

exposing the region to two additional diffusion-weighted gradients respectively substantially parallel to and substantially perpendicular to said effective direction;

producing two additional outputs indicative of the region's resonant responses respectively to said two additional diffusion-weighted gradients; and calculating a difference between said two additional outputs to generate said data set describing the shape and position of said selected structure.

49. The method of claim 36, wherein said data set describing the shape and position of said selected structure describes the shape and position of a selected cross section of said selected structure, and the steps used to generate said data set are repeated to generate additional data sets describing different cross sections of said selected structure, and a further data set that describes the three dimensional shape and position of a segment of said selected structure is generated by steps including:

analyzing the data representative of anisotropic diffusion to determine how to relate said data set and said additional data sets describing the shape and position of cross sections of said selected structure; and based upon the results of said step of analyzing the data representative of anisotropic diffusion, combining said data set and said additional data sets to generate said further data set that describes a three dimensional shape and position of the segment of said selected structure, thereby allowing the three dimensional shape and position of a curved structure exhibiting anisotropic diffusion to be described.

50. The method of claim 36, wherein said predetermined arrangement of gradients includes first, second, and third orthogonal gradients, and said data representative of anisotropic diffusion include a description of an effective vector representative of the anisotropic diffusion exhibited by said selected structure.

51. A method of utilizing magnetic resonance to determine data representative of diffusion anisotropy exhibited by a structure, said method including the steps of:

(a) exposing a region to a suppression sequence of electromagnetic fields that suppresses the electromagnetic responsiveness of structures in the region that do not exhibit diffusion anisotropy, so as to increase the apparent diffusion anisotropy of structures in the region that exhibit diffusion anisotropy, said suppression sequence of electromagnetic fields not including diffusion-weighted magnetic gradients;

(b) exposing the region to a predetermined arrangement of diffusion-weighted magnetic gradients, said predetermined arrangement of diffusion-weighted magnetic gradients chosen to:
  i) emphasize a selected structure in the region exhibiting diffusion anisotropy in a particular direction; and
  ii) suppress other structures in the region exhibiting diffusion anisotropy in directions different from said particular direction;

(c) for each of said diffusion-weighted gradients, sensing a resonant response of the region to the diffusion-weighted gradient and producing an output indicative of the resonant response; and (d) processing said outputs to generate data representative of the diffusion anisotropy of the selected structure.

52. The method of claim 51, wherein said data representative of the diffusion anisotropy of the selected structure is processed to produce a data set that describes the shape and position of the selected structure.

53. The method of claim 52, wherein the selected diffusion anisotropic structure is neural tissue in vivo and living.

54. A magnetic resonance apparatus for determining data representative of the diffusion anisotropy exhibited by a structure, said apparatus including:

(a) excitation and output arrangement means for exposing a region to a suppression sequence of electromagnetic fields that suppresses the electromagnetic responsiveness of structures in the region that do not exhibit diffusion anisotropy, so as to increase the apparent diffusion anisotropy of structures in the region that exhibit diffusion anisotropy, said suppression sequence of electromagnetic fields not including diffusion-weighted magnetic gradients;

(b) polarizing field source means positioned near said excitation and output arrangement means for exposing the region to a predetermined arrangement of diffusion-weighted magnetic gradients chosen to:
  i) emphasize a selected structure in the region exhibiting diffusion anisotropy in a particular direction; and
  ii) suppress other structures in the region exhibiting diffusion anisotropy in directions different from said particular direction, said excitation and output arrangement means further for sensing a resonant response of the region to the diffusion-weighted gradient and producing an output indicative of the resonant response, for each of said diffusion-weighted gradients; and (c) processor means coupled to said excitation and output arrangement means for processing said outputs to generate data representative of the diffusion anisotropy of the selected structure.

55. A magnetic resonance apparatus for determining the shape and position of a structure, said apparatus including:

(a) polarizing field source means for exposing a region to a magnetic polarizing field including a predetermined arrangement of diffusion-weighted gradients, the region including a selected structure that exhibits diffusion anisotropy and other structures that do not exhibit diffusion anisotropy;

(b) excitation and output arrangement means positioned near said polarizing field source means for:
  i) exposing the region to an electromagnetic excitation field; and
  ii) for each of said diffusion-weighted gradients, sensing a resonant response of the region to the excitation field and the polarizing field including the diffusion-weighted gradient and producing an output indicative of the resonant response; and (c) processor means coupled to said excitation and output arrangement means for:
  i) vector processing said outputs to generate data representative of anisotropic diffusion exhibited by the selected structure in the region, regardless of the alignment of said diffusion-weighted gradients with respect to the orientation of said selected structure; and
  ii) processing said data representative of anisotropic diffusion to generate a data set describing the shape and position of said selected structure in the region, said data set distinguishing said selected structure from other structures in the region that do not exhibit diffusion anisotropy.

56. The apparatus of claim 55, wherein said selected structure is neural tissue in a mammal and said other structures are non-neural tissue in the mammal.

57. The apparatus of claim 56, wherein:

said processor means is further for analyzing said data representative of anisotropic diffusion to determine an effective direction of the anisotropic diffusion exhibited by said neural tissue, so as to determine an optimal orientation for diffusion-weighted gradients;

said polarizing field source means is further for exposing the region to two additional diffusion-weighted gradients respectively substantially parallel to and substantially perpendicular to said effective direction;

said excitation and output arrangement means is further for producing two additional outputs indicative of the region's resonant responses respectively to said two additional diffusion-weighted gradients; and said processor means is further for determining the difference between said two additional outputs to generate said data set describing the shape and position of said neural tissue.

58. The apparatus of claim 56, wherein said data set describing the shape and position of said neural tissue describes the shape and position of a selected cross section of said neural tissue, and said apparatus is further for generating additional data sets describing different cross sections of said neural tissue, and said processor means is further for calculating a further data set that describes the three dimensional shape and position of a segment of said neural tissue by:

analyzing the data representative of anisotropic diffusion to determine how to relate said data set and said additional data sets describing the shape and position of cross sections of said neural tissue; and based upon the results of said analyzing the data representative of anisotropic diffusion, combining said data set and said additional data sets to generate said further data set that describes the three dimensional shape and position of the segment of said neural tissue, thereby allowing a three dimensional shape and position of curved neural tissue to be described.

59. The apparatus of claim 56, wherein said predetermined arrangement of gradients includes first, second, and third orthogonal gradients, and said data representative of anisotropic diffusion include a description of an effective vector representative of the anisotropic diffusion exhibited by said neural tissue.

60. The apparatus of claim 55, wherein:

said processor means is further for analyzing said data representative of anisotropic diffusion to determine an effective direction of the anisotropic diffusion exhibited by said selected structure, so as to determine an optimal orientation for diffusion-weighted gradients;

said polarizing field source means is further for exposing the region to two additional diffusion-weighted gradients respectively substantially parallel to and substantially perpendicular to said effective direction;

said excitation and output arrangement means is further for producing two additional outputs indicative of the region's resonant responses respectively to said two additional diffusion-weighted gradients; and said processor means is further for determining a difference between said two additional outputs to generate said data set describing the shape and position of said selected structure.

61. The apparatus of claim 55, wherein said data set describing the shape and position of said selected structure describes the shape and position of a selected cross section of said selected structure, and said apparatus is further for generating additional data sets describing different cross sections of said selected structure, and said processor means is further for determining a further data set that describes the three dimensional shape and position of a segment of said selected structure by:

analyzing the data representative of anisotropic diffusion to determine how to relate said data set and said additional data sets describing the shape and position of cross sections of said selected structure; and based upon the results of said analyzing the data representative of anisotropic diffusion, combining said data set and said additional data sets to generate said further data set that describes the three dimensional shape and position of the segment of said selected structure, thereby enabling a three dimensional shape and position of curved structure exhibiting anisotropic diffusion to be described.

62. The apparatus of claim 55, wherein said predetermined arrangement of gradients includes first, second, and third orthogonal gradients, and said data representative of anisotropic diffusion include a description of an effective vector representative of the anisotropic diffusion exhibited by said selected structure.

63. The method of claim 61, wherein the selected diffusion anisotropic structure is a member of the group consisting of peripheral nerves, cranial nerves numbers three through twelve, and autonomic nerves, and is living.

64. The apparatus of claim 61, wherein said processor means is further for processing said data representative of the diffusion anisotropy of the selected structure to produce a data set that describes the shape and position of the selected structure.

65. The apparatus of claim 64, wherein the selected diffusion anisotropic structure is neural tissue and is living.

66. The apparatus of claim 64, wherein the selected diffusion anisotropic structure is a member of the group consisting of peripheral nerves, cranial nerves numbers three through twelve, and autonomic nerves, and is living.

* * * * *

UNITED STATES PATENT AND TRADEMARK OFFICE
CERTIFICATE OF CORRECTION

PATENT NO. : 5,560,360
DATED : October 1, 1996
INVENTOR(S) : A.G. Filler et al.

It is certified that error appears in the above-identified patent and that said Letters Patent is hereby corrected as shown below:

On the title page

| COLUMN | LINE | | | | |
|---|---|---|---|---|---|
| [75] Pg. 1, col. 1 | Inventors | "Jay S. Tsurda" should read --Jay S. Tsuruda-- | | | |
| [56] Pg. 1, col. 2 | Refs. Cited (U.S. Pats.) | Insert the following reference: --5,185,576 | 2/1993 | Vavrek et al. | 324/318-- |
| [56] Pg. 1, col. 2 | Refs. Cited (U.S. Pats.) | Insert the following references: --4,868,501 | 9/1989 | Conolly | 324/309 |
| | | 4,843,322 | 6/1989 | Glover | 324/309 |
| | | 4,901,020 | 2/1990 | Ladebeck et al. | 324/309 |
| | | 4,714,081 | 12/1987 | Dumoulin et al. | 128/653 |
| | | 4,528,985 | 7/1985 | Macovski | 128/653 |
| | | 4,836,209 | 6/1989 | Nishimura | 128/653 |
| | | 4,516,582 | 5/1985 | Redington | 128/653 |
| | | 4,647,857 | 3/1987 | Taber | 324/309 |
| | | 4,777,957 | 10/1988 | Wehrli et al. | 128/653-- |
| [56] Pg. 1, col. 2 | Refs. Cited (Foreign Pats.) | Insert the following references: --JP3133423 | 6/1991 | Japan | |
| | | JP2077239 | 3/1990 | Japan | |
| | | WO 90/05494 | 5/1990 | PCT-- | |

UNITED STATES PATENT AND TRADEMARK OFFICE
CERTIFICATE OF CORRECTION

PATENT NO. : 5,560,360
DATED : October 1, 1996
INVENTOR(S) : A.G. Filler et al.

It is certified that error appears in the above-identified patent and that said Letters Patent is hereby corrected as shown below:

COLUMN     LINE

[56] Refs. Cited    Insert the following references:
Pg. 1, col. 2 (Other Publs.)

--M. Doran et al., "Normal and Abnormal White Matter Tracts Shown By MR Imaging Using Directional Diffusion Weighted Sequences," *Journal Of Computer Assisted Tomography* 14(6): 865-873 (November/December 1990).

M. Doran et al., "Magnetic Resonance: Perfusion and Diffusion Imaging," *Neuroradiology* 32:392-398 (1990).

M.E. Moseley et al., "Diffusion-weighted MR Imaging of Anisotropic Water Diffusion in CAT Central Nervous System," *Radiology*, 176:439-445 (August 1990).

J.V. Hajnal et al., "MR Imaging of Anisotropically Restricted Diffusion of Water in the Nervous System: Technical, Anatomic, and Pathologic Considerations," *Journal Of Computer Assisted Tomography*, 15:1-18 (January 1991).

M.E. Moseley et al., "Diffusion-Weighted MR Imaging of Acute Stroke: Correlation with T2-Weighted and Magnetic Susceptibility-Enhanced MR Imaging in Cats," *ANJR* 11:423-429 (May/June 1990).

UNITED STATES PATENT AND TRADEMARK OFFICE
CERTIFICATE OF CORRECTION

PATENT NO. : 5,560,360
DATED : October 1, 1996
INVENTOR(S) : A.G. Filler et al.

It is certified that error appears in the above-identified patent and that said Letters Patent is hereby corrected as shown below:

COLUMN     LINE

[56]     Refs. Cited     D. Chien et al., "MR Diffusion Imaging of the Human
Pg. 1, col. 2     (Other     Brain," *Journal Of Computer Assisted Tomography*,
    Publs.)     14(4):514-520 (July/August 1990).

(continued)

G.M. Bydder et al.,"MR Imaging of Anisotropically Restricted Diffusion of Water in Tumors of the Central Nervous System", *Book of Abstracts, Society of Magnetic Resonance in Medicine* (1991).

J.S. Schoeniger et al., "NMR Microscopy of Single Neurons" *Book of Abstracts, Society of Magnetic Resonance in Medicine* (1991).

Douek et al., "Myelin Fiber Orientation Color Mapping," *Book of Abstracts, Society of Magnetic Resonance in Medicine*, 919 (1991).

M.E. Moseley et al., "Anisotropy in Diffusion-Weighted MRI," *Magnetic Resonance In Medicine*, 19:321 (1991).

J.R. MacFall et al., "Pre- and Postmorten Diffusion Coefficients in Rat Neural and Muscle Tissues," *Magnetic Resonance In Medicine* 20:89-99 (1991).

UNITED STATES PATENT AND TRADEMARK OFFICE
CERTIFICATE OF CORRECTION

PATENT NO. : 5,560,360
DATED : October 1, 1996
INVENTOR(S) : A.G. Filler et al.

It is certified that error appears in the above-identified patent and that said Letters Patent is hereby corrected as shown below:

COLUMN    LINE

[56]    Refs. Cited    M.E. Moseley et al., "Ultrafast Magnetic Resonance
Pg. 1, col. 2    (Other    Imaging: Diffusion and Perfusion," *Canadian Association*
     Publs.)    *Of Radiologists*, 42(1):31-38 (February 1991).

*(continued)*    D. LeBihan et al., "Measuring Random Microscopic Motion of Water in Tissues with MR Imaging: A Cat Brain Study," *Journal Of Computer Assisted Tomography*, 15(1):19-25 (January/February 1991).

Chenevert et al., "Quantitative Diffusion Anisotropy in Rat Gliomas," *Book of Abstracts, Society of Magnetic Resonance in Medicine*, 787 (1991).

D. LeBihan, "Diffusion/Perfusion MR Imaging of the Brain: From Structure to Function," *Radiology*, 177:328-329 (1990).

M.E. Moseley et al., "Acute Effects of Exercise on Echo-Planar $T_2$ and Diffusion-Weighted MRI of Skeletal Muscle in Volunteers," *Book of Abstracts, Society of Magnetic Resonance in Medicine*, 108 (1991).

UNITED STATES PATENT AND TRADEMARK OFFICE
CERTIFICATE OF CORRECTION

PATENT NO.   : 5,560,360
DATED        : October 1, 1996
INVENTOR(S)  : A.G. Filler et al.

Page 5 of 9

It is certified that error appears in the above-identified patent and that said Letters Patent is hereby corrected as shown below:

COLUMN    LINE

[56]     Refs. Cited     Neeman et al., "A Simple Method for Obtaining Cross-
Pg. 1, col. 2    (Other    Term-Free Images for Diffusion Anisotropy Studies in
   Publs.)    NMR Microimaging," *Book of Abstracts, Society of*
    *Magnetic Resonance in Medicine* (1991).
*(continued)*

J. Guy et al., "Fat Suppression MRI; Gd-DTPA Enhancement in Experimental Optic Neuritis," *Book of Abstracts, Society of Magnetic Resonance in Medicine*, 913 (1991).

G. Sze, "Recent Advances in Spinal Magnetic Resonance Imaging," *Canadian Association of Radiologists Journal*, 42(3):190-198 (June 1991).

Haase et al., "NMR Chemical Shift Selective Imaging", 30 *Phys. Med. Biol.* 341-344 (1985).

Dixon et al., "Simple Proton Spectroscopic Imaging", 153 *Radiology* 189-194 (1984).

Shuman et al., "Improved Fat Suppression in STIR MR Imaging: Selecting Inversion Time Through Spectral Display", 178 *Radiology* 885-889 (1991).

UNITED STATES PATENT AND TRADEMARK OFFICE
CERTIFICATE OF CORRECTION

PATENT NO. : 5,560,360
DATED : October 1, 1996
INVENTOR(S) : A.G. Filler et al.

It is certified that error appears in the above-identified patent and that said Letters Patent is hereby corrected as shown below:

COLUMN  LINE

[56] Pg. 1, col. 2 — Refs. Cited (Other Publs.) *(continued)*

D.N. Blair et al., "Normal Brachial Plexus: MR Imaging," *Radiology*, 165:763-767 (1987).

L.M. Fahr et al., "Imaging of Peripheral Nerve Lesions," *Orthopedic Clinics Of North America*, 19(1):27-41 (January 1988).

B. Roger et al., "Imaging of Posttraumatic Brachial Plexus Injury," *Clinical Orthopaedics And Related Research*, 237:57-61 (December 1988).

R.R. Tash, M.D., et al., "Trigeminal Neuralgia: MR Imaging Features," *Radiology* 172:767-770 (1989).

M. Mesgarzadeh et al., "Carpal Tunnel: MR Imaging, Part II. Carpal Tunnel Syndrome," *Radiology*, 171:749-754 (1989).

M. Mesgarzadeh et al., "Carpal Tunnel: MR Imaging," *Radiology* 171:743-748 (1989).

UNITED STATES PATENT AND TRADEMARK OFFICE
CERTIFICATE OF CORRECTION

PATENT NO. : 5,560,360
DATED : October 1, 1996
INVENTOR(S) : A.G. Filler et al.

It is certified that error appears in the above-identified patent and that said Letters Patent is hereby corrected as shown below:

COLUMN    LINE

[56]         Refs. Cited    D.S. Titelbaum et al., "Wallerian Degeneration and Inflammation in Rat Peripheral Nerve Detected by in Vivo MR Imaging," *ANJR* 10:741-746 (July/August 1989).
Pg. 1, col. 2    (Other Publs.)

*(continued)*    M.J. Kuhn et al., "Wallerian Degeneration After Cerebral Infarction: Evaluation with Sequential MR Imaging," *Radiology* 172:179-182 (1989).

J.K. Kostelic et al., "Lumbar Spinal nerves in the Neural Foramen: MR Appearance," *Radiology* 178:837-839 (1991).

Atlas et al., "STIR MR Imaging of the Orbit," *151 Am. J. Roentgen* 151:1025-1030 (1988).

Saloner et al., "Application of a Connected-Voxel Algorithm to MR Angiographic Data, 1 *Journal of Magnetic Resonance Imaging* 423--430 (1991).

B. Penev et al., "Neurography Using the Intramuscular Injection of Ionic Iodine Contrast Media," *Neuroradiology* 32:316-318 (1990).

UNITED STATES PATENT AND TRADEMARK OFFICE
CERTIFICATE OF CORRECTION

PATENT NO. : 5,560,360
DATED : October 1, 1996
INVENTOR(S) : A.G. Filler et al.

It is certified that error appears in the above-identified patent and that said Letters Patent is hereby corrected as shown below:

| COLUMN | LINE | |
|---|---|---|
| [56]<br>Pg. 1, col. 2 | Refs. Cited<br>(Other<br>Publs.)<br>*(continued)* | M. Takeshita et al., "Neurography of the Brachial Plexus in the Thoracic Outlet Syndrome," *International Orthopaedics (SICOT)* 15:1-5 (1991).<br><br>P.B. Roemer et al., "The NMR Phased Array," *Magnetic Resonance In Medicine* 16:192-225 (1990).<br><br>C.E. Hayes et al., "Volume Imaging with MR Phased Arrays," *Magnetic Resonance In Medicine* 18:309-319 (1991).<br><br>F.G. Shellock et al., "Kinematic Magnetic Resonance Imaging of the Joints: Techniques and Clinical Applications," *Magnetic Resonance Quarterly*, 7(2):104-135 (1991).-- |
| 42<br>(Claim 30, | 16<br>line 1) | After "wherein" insert --,-- |
| 44<br>(Claim 48, | 41<br>line 1) | "claim 46" should read --claim 36-- |
| 48<br>(Claim 63, | 29<br>line 1) | "claim 61" should read --claim 52-- |

UNITED STATES PATENT AND TRADEMARK OFFICE
CERTIFICATE OF CORRECTION

| | | |
|---|---|---|
| PATENT NO. : | 5,560,360 | |
| DATED : | October 1, 1996 | |
| INVENTOR(S) : | A.G. Filler et al. | |

It is certified that error appears in the above-identified patent and that said Letters Patent is hereby corrected as shown below:

COLUMN    LINE 48           33           "claim 61" should read --claim 54--
(Claim 64,   line 1)

Signed and Sealed this

Twenty-first Day of September, 1999

*Attest:*

Q. TODD DICKINSON

*Attesting Officer*     *Acting Commissioner of Patents and Trademarks*